US012128805B2

(12) United States Patent
Sato et al.

(10) Patent No.: US 12,128,805 B2
(45) Date of Patent: Oct. 29, 2024

(54) VEHICLE SYSTEM AND VIBRATION GENERATION DEVICE

(71) Applicant: ALPS ALPINE CO., LTD., Tokyo (JP)

(72) Inventors: Kunio Sato, Miyagi (JP); Toshiki Tachioka, Miyagi (JP); Kaede Mochida, Miyagi (JP)

(73) Assignee: ALPS ALPINE CO., LTD., Tokyo (JP)

( * ) Notice: Subject to any disclaimer, the term of this patent is extended or adjusted under 35 U.S.C. 154(b) by 124 days.

(21) Appl. No.: 18/054,240

(22) Filed: Nov. 10, 2022

(65) Prior Publication Data

US 2023/0075857 A1 Mar. 9, 2023

Related U.S. Application Data

(63) Continuation of application No. PCT/JP2021/018276, filed on May 13, 2021.

(30) Foreign Application Priority Data

Jul. 14, 2020 (JP) ................................ 2020-120777

(51) Int. Cl.

*B60N 2/90* (2018.01)
*B60R 16/02* (2006.01)
*G06F 3/048* (2013.01)

(52) U.S. Cl.

CPC .............. *B60N 2/90* (2018.02); *B60N 2/976* (2018.02); *B60R 16/02* (2013.01); *G06F 3/048* (2013.01)

(58) Field of Classification Search

CPC .......... B60N 2/90; B60N 2/976; B60R 16/02; G06F 3/048

See application file for complete search history.

(56) References Cited

U.S. PATENT DOCUMENTS 8,339,285 B2 * 12/2012 Boren .................... G08B 21/24 340/407.1
10,449,874 B2 * 10/2019 Sugiyama ............ B60N 2/5816
10,940,872 B2 * 3/2021 Alexiou ............... B60N 2/5891
11,618,361 B2 * 4/2023 Yan .......................... B60N 2/90 381/86
2009/0243842 A1 * 10/2009 Mitchell .................. G07C 5/08 340/539.26

(Continued)

FOREIGN PATENT DOCUMENTS

JP 2002-017513 1/2002
JP 2006-007919 1/2006

(Continued)

OTHER PUBLICATIONS

International Search Report for PCT/JP2021/018276 mailed on Jul. 13, 2021.

*Primary Examiner* — Philip F Gabler
(74) *Attorney, Agent, or Firm* — IPUSA, PLLC

(57) ABSTRACT

A vehicle system includes a seat of a vehicle, and a vibration generation device provided in the seat. The vibration generation device includes a housing, a diaphragm supported on the housing, an actuator attached to at least one of the housing and the diaphragm, and a sensor, including a detection electrode, and configured to detect a user approaching the detection electrode. The diaphragm and the detection electrode are famed by a common member.

17 Claims, 20 Drawing Sheets

300
300A
320
10
200C (200) 200A (200) 200B (200) 11
11C
11A1
11A
11A2

(56) References Cited

U.S. PATENT DOCUMENTS

| | | | | |
|---|---|---|---|---|
| 2019/0031065 | A1* | 1/2019 | Kamei | B60N 2/5621 |
| 2019/0344043 | A1* | 11/2019 | Migneco | A61B 5/0205 |
| 2020/0079248 | A1* | 3/2020 | Yamamoto | B60N 2/002 |
| 2021/0038435 | A1* | 2/2021 | Guidetti | A47C 7/72 |
| 2021/0387231 | A1* | 12/2021 | Sato | H04R 7/16 |
| 2022/0340064 | A1* | 10/2022 | Soltner | A61H 1/005 |

FOREIGN PATENT DOCUMENTS

| | | |
|---|---|---|
| JP | 2019-077432 | 5/2019 |
| WO | 2019/244755 | 12/2019 |

* cited by examiner

12
ECU
330B
321
322
323
320
CONTROLLER
DETERMINATION UNIT
CONTROL UNIT
MEMORY
300
330A
310
312
311
240
312
311
310
260
200
220

220
I
I
110
140A
114A
130A
113A
160
112
130B
113B
114B
140B
X1
X2
Y1
Y2

I
I
110
140A
114A
130A
113A
112
130B
113B
114B
140B
X1
X2
Y1
Y2

220
140B
114B
130B
163
613
130B
113B
111
160
161
112
110
130A
612
162
113A
130A
120
114A
140A
Y2
Z1
Z2
Y1

220
140B
130B
163
160
190D
161
162
130A
120
140A
N
S
114B
113B
111
112
110
113A
114A
Z1
Z2
Y1
Y2

220
140B
114B
N
130B
163
S
113B
111
160
190L
S
112
110
161
162
N
113A
130A
N
120
S
114A
140A
Z1
Z2
Y1
Y2

220
140B
140A
130B
130A
163
161
162
160
190R
120
114B
113B
111
112
113A
114A
110
S
N
N
S
N
S
S
N
Z1
Z2
Y1
Y2

START
S1
PREDETERMINED NOTIFICATION CONDITION STANDS?
NO
YES
S2
CAUSE DETERMINATION BY DETERMINATION UNIT
S3
CLOSE CONTACT STATE?
NO
YES
S5
CONTACT STATE?
NO
YES
S4
GENERATE VIBRATION
S6
GENERATE STRONG SOUND
S7
GENERATE WEAK SOUND

VEHICLE SYSTEM AND VIBRATION GENERATION DEVICE

CROSS-REFERENCE TO RELATED APPLICATIONS

This application is a continuation application of International Application No. PCT/JP2021/018276 filed on May 13, 2021 and designated the U.S., which is based upon and claims priority to Japanese Patent Application No. 2020-120777, filed on Jul. 14, 2020, the entire contents of which are incorporated herein by reference.

BACKGROUND OF THE INVENTION

1. Field of the Invention

The present invention relates to vehicle systems and vibration generation devices.

2. Description of the Related Art

A vehicle operation unit in related art includes a diaphragm (or a thin vibrating film) provided in front inside a vehicle cabin, an operation part provided integrally with or in close proximity in an overlapping manner to the diaphragm and operated when touched by an occupant, and a detecting part that detects an operation when the operation part is operated. In such a vehicle operation unit, when the detecting part detects the operation of the operation part, at least a region of the diaphragm corresponding to the operation part is vibrated, to provide a confirmation vibration for notifying the occupant of accepting the operation. In addition, when an acoustic signal is input, the diaphragm is vibrated to provide an acoustic output. As an example, Japanese Laid-Open Patent Publication No. 2006-007919 proposes a vehicle operation unit of this type.

According to the vehicle operation unit of the related art, the diaphragm and the detecting part are separate bodies. For this reason, it is impossible to present the vibration or sound at the position where a detection is made.

SUMMARY OF THE INVENTION

One aspect of the embodiments of the present invention provides a vehicle system and a vibration generation device, capable of providing vibration or sound at a position where a detection is made.

According to one aspect of the embodiments of the present invention, a vehicle system includes a seat of a vehicle; and a first vibration generation device provided in the seat, wherein the first vibration generation device includes a first housing, a first diaphragm supported on the first housing, a first actuator attached to at least one of the first housing and the first diaphragm, and a first sensor, including a first detection electrode, and configured to detect a user approaching the first detection electrode, and wherein the first diaphragm and the first detection electrode are formed by a common member.

According to another aspect of the embodiments of the present invention, a vibration generation device adaptable to a seat of a vehicle, includes a housing; a diaphragm supported on the housing; an actuator attached to at least one of the housing and the diaphragm; and a sensor, including a detection electrode, and configured to detect a target approaching the detection electrode, wherein the diaphragm and the detection electrode are formed by a common member.

Other objects and further features of the present invention will be apparent from the following detailed description when read in conjunction with the accompanying drawings.

DESCRIPTION OF THE PREFERRED EMBODIMENTS

Hereinafter, embodiments applied with a vehicle system and a vibration generation device according to the present invention will be described.

First Embodiment

Figure 1:
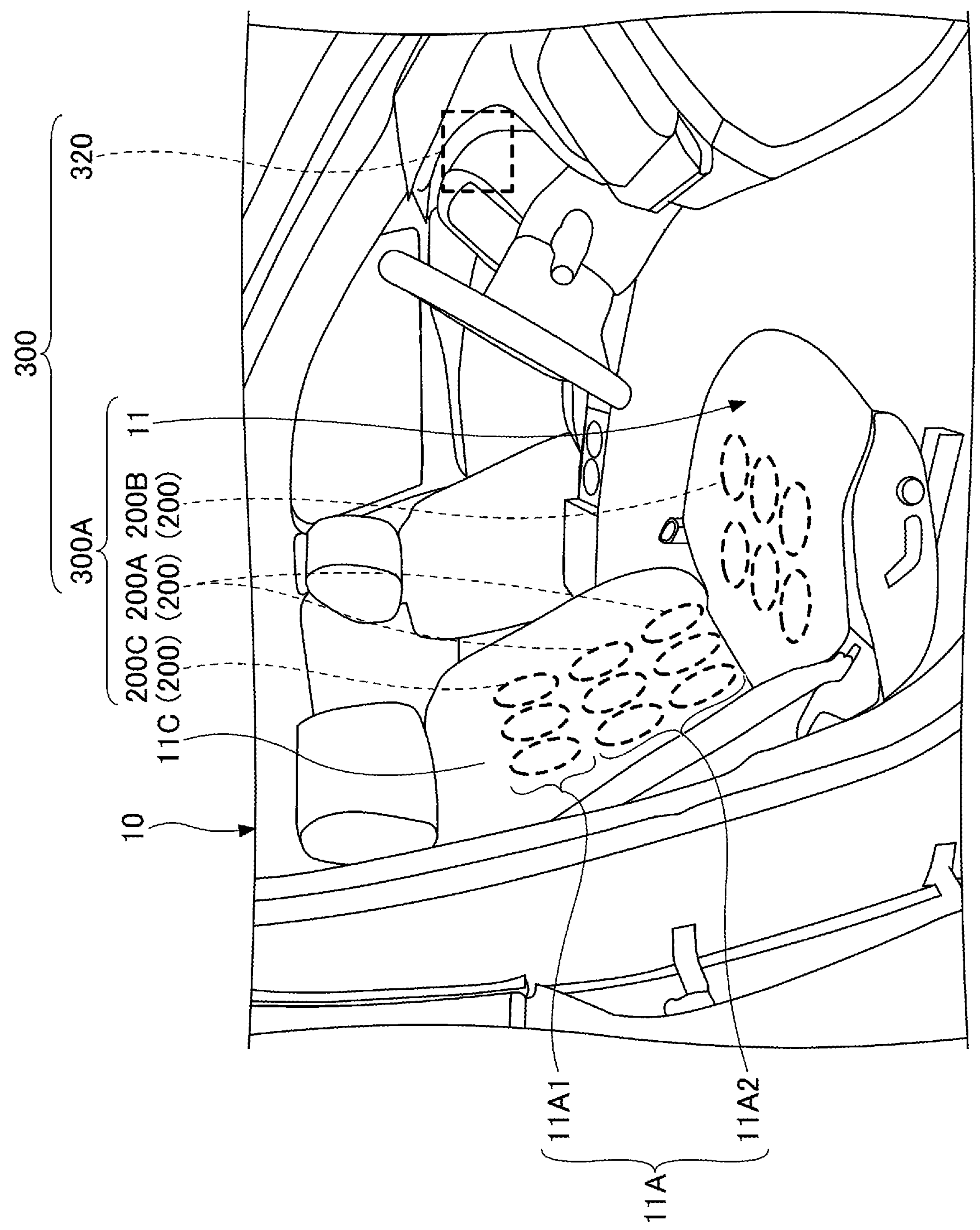
FIG. 1 is a diagram illustrating an inside of a vehicle 10.

FIG. 1 is a diagram illustrating an inside of a vehicle 10. A seat 11 is arranged inside a cabin of the vehicle 10. The seat 11 includes a backrest part (or seatback) 11A and a seating part (or seat cushion) 11B. The backrest part 11A and the seating part 11B are covered with a seat covering material 11C. In a first embodiment, an example in which the seat 11 is a driver's seat will be described. However, the seat 11 may be any seat provided in the vehicle 10, and may be a front passenger seat or a rear passenger seat, for example.

The vehicle 10 is provided with a vehicle system 300 according to the present embodiment. The vehicle system 300 includes a vehicle seat system 300A, and a controller 320. The vehicle seat system 300A includes the seat 11, and vibration generation devices 200 (200A, 200B, 200C). Because the vibration generation devices 200A, 200B, and 200C have the same configuration, each of the vibration generation devices 200A, 200B, and 200C will simply be referred to as the vibration generation device 200 when not distinguishing vibration generation devices 200A, 200B, and 200C from one another. The vibration generation device 200 according to the present embodiment is thus adaptable to the seat 11 of the vehicle 10.

As an example, six vibration generation devices 200A and three vibration generation devices 200C are provided (or built-in) in the backrest part 11A, and six vibration generation devices 200B are provided (or built-in) in the seating part 11B. The six vibration generation devices 200A are arranged in a middle stage and a lower stage (or a lowermost stage) among three stages of the nine vibration generation devices 200 arranged in an up-down direction (or a vertical direction) of the backrest part 11A, where three vibration generation devices 200 are arranged in a left-right direction (or a horizontal direction) in each of the three stages of the backrest part 11A. The three vibration generation devices 200C are arranged in an upper stage (or an uppermost stage) among the three stages of the backrest part 11A. That is, the three vibration generation device 200C are provided in a region 11A2 of the backrest part 11A above a region 11A1 where the six vibration generation devices 200A are provided.

The vibration generation device 200A is an example of a first vibration generation device, the vibration generation device 200B is an example of a second vibration generation device, and the vibration generation device 200C is an example of a third vibration generation device. In the backrest part 11A, the region 11A1 where the vibration generation devices 200A are arranged is an example of a first region, and the region 11A2 where the vibration generation devices 200C are arranged is an example of a second region.

The vibration generation device 200 (200A, 200B, 200C) is driven by the controller 320 in a case where a predetermined notification condition stands, and generates vibration or sound when driven. All the vibration generation devices 200 are connected to the controller 320 via communication cables, and are driven controlled by the controller 320. The controller 320 is arranged on a back of a dashboard, for example. The communication cables are communication cables in conformance with a standard, such as a controller area network (CAN) or the like, for example. Communication between the vibration generation device 200 and the controller 320 is not limited to a cable communication using the communication cable, and may be a wireless communication.

Figure 2:
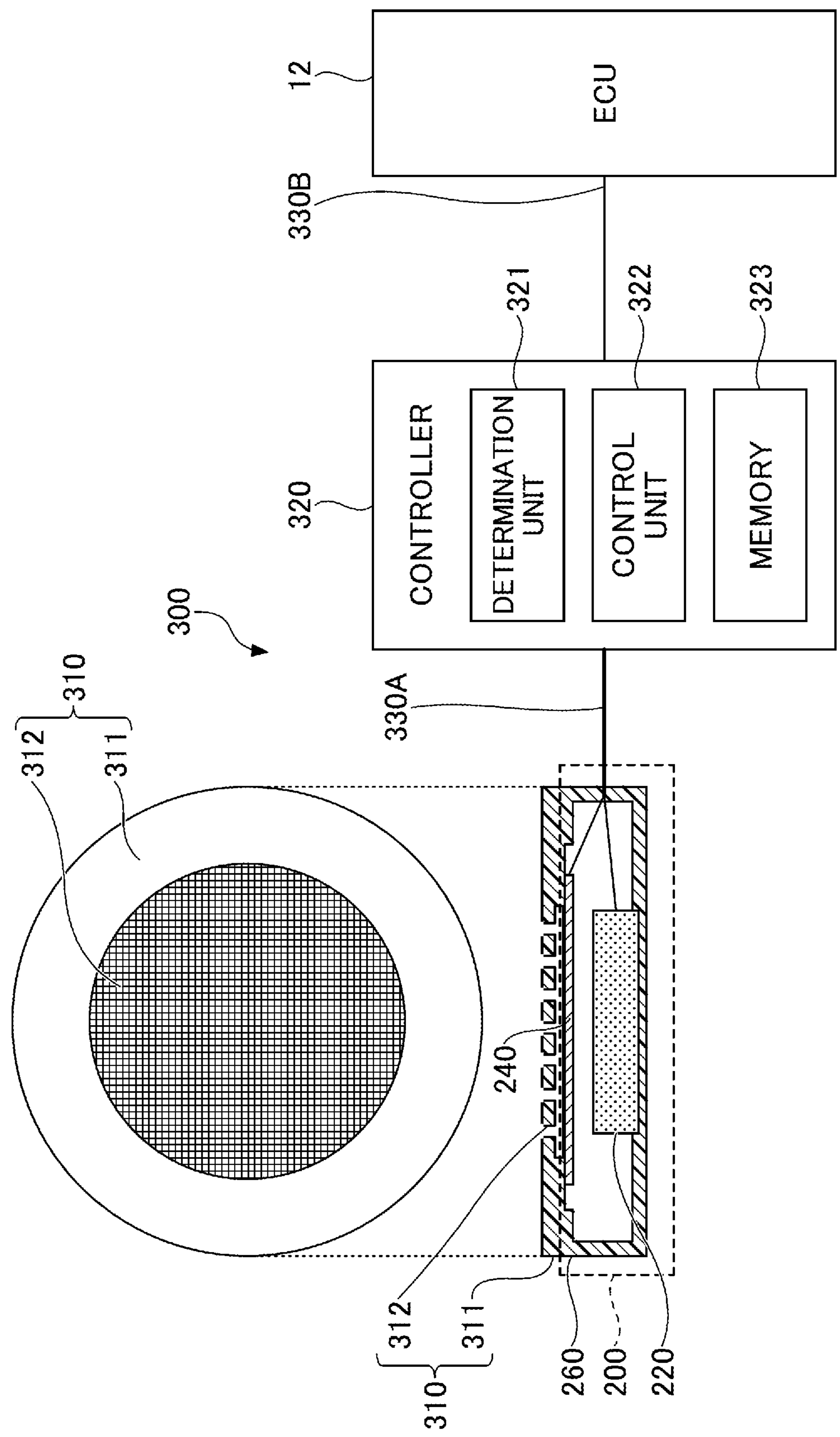
FIG. 2 is a diagram illustrating a configuration of a vehicle system 300.

FIG. 2 is a diagram illustrating a configuration of the vehicle system 300. In FIG. 2, for the sake of convenience, the illustration of the seat 11 is omitted, and both a planar configuration and a cross sectional configuration of the vibration generation device 200 are illustrated. The cross sectional configuration of the vibration generation device 200 illustrated in FIG. 2 is a cross section taken along a plane passing through a center of the vibration generation device 200 having a circular shape in the plan view.

The vibration generation device 200 and the controller 320 are connected via a communication cable 330A, and an electronic control unit (ECU) 12 is connected to the controller 320 via a communication cable 330B. Although one vibration generation device 200 is illustrated in FIG. 2, a plurality of vibration generation devices 200 are actually connected to the controller 320 via a plurality of communication cables 330A.

The configuration of the vibration generation device 200 is illustrated in a simplified manner in FIG. 2, and includes an actuator 220, a diaphragm 240, and a housing 260 which may form main constituent elements of the vibration generation device 200. The actuator 220 is arranged inside the housing 260, and the diaphragm 240 is provided at an upper portion of the housing 260.

The actuator 220, the diaphragm 240, and the housing 260 of the vibration generation device 200A illustrated in FIG. 1 are examples of a first actuator, a first diaphragm, and a first housing, respectively. The diaphragm 240 of the vibration generation device 200A illustrated in FIG. 1 is also an example of a first detection electrode of a first sensor. The actuator 220, the diaphragm 240, and the housing 260 of the vibration generation device 200B illustrated in FIG. 1 are examples of a second actuator, a second diaphragm, and a second housing, respectively. The diaphragm 240 of the vibration generation device 200B illustrated in FIG. 1 is also an example of a second detection electrode of a second sensor. The actuator 220, the diaphragm 240, and the housing 260 of the vibration generation device 200C illustrated in FIG. 1 are examples of a third actuator, a third diaphragm, and a third housing, respectively. The diaphragm 240 of the vibration generation device 200C illustrated in FIG. 1 is also an example of a third detection electrode of a third sensor.

The diaphragm 240 is a thin plate including a conductor, and is made of a metal, such as aluminum or the like, for example. When the actuator 220 of the vibration generation device 200 is driven, the diaphragm 240 vibrates according to the driven actuator 220, and vibrates surrounding air to generate a sound. That is, the diaphragm 240 behaves like a diaphragm of a speaker. The diaphragm 240 is also a detection electrode of a sensor, such as a self-capacitance type capacitive sensor (or electrostatic capacitance sensor) or the like, for example. When a user (or human body) approaches the diaphragm 240 and an electrostatic capacitance between the diaphragm 240 and the human body varies, the controller 320 determines whether or not the user is in close contact with the seat 11 or the like. Thus, the diaphragm 240 is also used as the detection electrode of the sensor. In other words, the diaphragm 240 and the detection electrode of the sensor are famed by a common member (that is, the same member forms the diaphragm 240 and the detection electrode of the sensor). The sensor is formed by the diaphragm 240 that is used as the detection electrode, but may be configured to include an element that is other than the diaphragm 240 and functions as the detection electrode. The user may be a seating person who can approach the seat 11 in order to sit thereon, sit on the seating part 11B of the seat 11, and sit deeply on the seating part 11B by leaning against the backrest part 11A of the seat 11.

The vibration generation device 200 generates the vibration or the sound, when driven and controlled by the controller 320. More particularly, the vibration generated by the driven actuator 220 is transmitted to the housing 260, and the housing 260 vibrates the seat 11. In addition, the vibration generated by the driven actuator 220 is transmitted to the diaphragm 240, and the diaphragm 240 vibrates to vibrate the surrounding air and generate the sound.

The controller 320 drives the vibration generation device 200 when a notification indicating that the predetermined notification condition stands is received from the ECU 12. The predetermined notification condition is a condition necessary for issuing an alert or the like to the user, for example. More particularly, when the ECU 12 issues an alert with respect to a deviation from a traffic lane, excess speeding, or the like, for example, the notification, indicating that the predetermined notification condition stands, may be supplied to the controller 320. Further, the ECU 12 may determine whether or not the predetermined notification condition stands, and supply to the controller 320 the notification indicating that the predetermined notification condition stands, on a precondition that a seated state of a user of the vehicle is detected by a seating sensor or the like, or an ignition is turned on in a case where the seat 11 is a driver's seat. Details of the vibration generation device 200 will be described later in conjunction with to FIG. 3 through FIG. 12.

A cover 310 is attached to the vibration generation device 200. The cover 310 is included in the vehicle seat system 300A illustrated in FIG. 1, together with the seat 11 and the vibration generation devices 200. The cover 310 is attached to a surface of the vibration generation device 200, and includes an annular frame 311, and a mesh portion 312. The mesh portion 312 is attached to the frame 311, and includes a plurality of holes having a planar arrangement. The holes of the mesh portion 312 communicate to both surfaces of the cover 310.

The cover 310 is arranged on a back of openings in a mesh-like pattern or the like provided in a seat covering material 11C of the seat 11, and protects the vibration generation device 200. By attaching the vibration generation device 200 to a back surface of the seat covering material 11C via the cover 310, it is possible to reduce contact of the seat covering material 11C with the diaphragm 240, even when the back of the seat covering material 11C is pressed by the user from a front of the seat covering material 11C. For this reason, the vibration of the diaphragm 240 will not be interfered, and an excellent sound can be generated.

The controller 320 includes a determination unit 321, a control unit 322, and a memory 323. The controller 320 may be formed by a computer including a central processing unit (CPU), a random access memory (RAM), a read only memory (ROM), an input-output (I/O) interface, an internal bus, or the like, for example. The determination unit 321 and the control unit 322 are functional blocks representing functions of one or more programs executed by the controller 320. The memory 323 is a functional block representing a function of a memory of the controller 320.

The determination unit 321 determines whether or not the user is in close contact with the seat 11, based on an output of the diaphragm 240 that functions as the sensor of the vibration generation device 200. For example, in the case where the diaphragm 240 is the detection electrode of the capacitive sensor (or electrostatic capacitance sensor), the determination unit 321 determines whether or not the user is in close contact with the seat 11, based on a change in the electrostatic capacitance of the diaphragm 240. A technique used by the determination unit 321 to determine whether or not the user is in close contact with the seat 11, will be described later in conjunction with FIG. 13A through FIG. 13C.

A portion of the determination unit 321 that determines whether or not the user is in close contact with the first region 11A1 of the backrest part 11A of the seat 11, based on a change in the electrostatic capacitance of the diaphragm 240 of the vibration generation device 200A illustrated in FIG. 1, is an example of a first determination unit. A portion of the determination unit 321 that determines whether or not the user is in close contact with the seating part 11B of the seat 11, based on a change in the electrostatic capacitance of the diaphragm 240 of the vibration generation device 200B illustrated in FIG. 1, is an example of a second determination unit. A portion of the determination unit 321 that determines whether or not the user is in close contact with the second region 11A2 of the backrest part 11A of the seat 11, based on a change in the electrostatic capacitance of the diaphragm 240 of the vibration generation device 200C illustrated in FIG. 1, is an example of a third determination unit. The determination unit 321 may be divided into separate determination units configured in correspondence with the vibration generation devices 200A, 200B, and 200C, respectively.

The control unit 322 drives and controls the vibration generation device 200, based on a determination result of the determination unit 321. In the control unit 322, a portion that drives and controls the vibration generation device 200A is an example of a first control unit, a portion that drives and controls the vibration generation device 200B is an example of a second control unit, and a portion that drives and controls the vibration generation device 200C is an example of a third control unit. The portions that drive and control the vibration generation devices 200A, 200B, and 200C, respectively, are included in a single control unit 322, and can mutually refer to data of one another. When the portions of the control unit 322 can mutually refer to data of one another, it is possible to perform control or the like using determination results of other types of vibration generation devices 200.

The control unit 322 may be divided into separate control units configured in correspondence with the vibration generation devices 200A, 200B, and 200C, respectively. Even in this case, the separate control units of the control unit 322 may be configured to mutually refer to data of one another. In this case, it is possible to perform control or the like using the determination results of other types of vibration generation devices 200. Specific control contents of the control unit 322 will be described later in conjunction with FIG. 13A through FIG. 13C.

The memory 323 stores programs, data, or the like required by the determination unit 321 and the control unit 322 to perform the respective controls.

The ECU 12 may be an ECU that controls autonomous driving of the vehicle 10, for example. Although the ECU 12 in this example is the ECU that controls the autonomous driving as described hereinafter, the ECU 12 may be an ECU other than the ECU that controls the autonomous driving. Moreover, the controller 320 may be included in the ECU 12.

Figure 3:
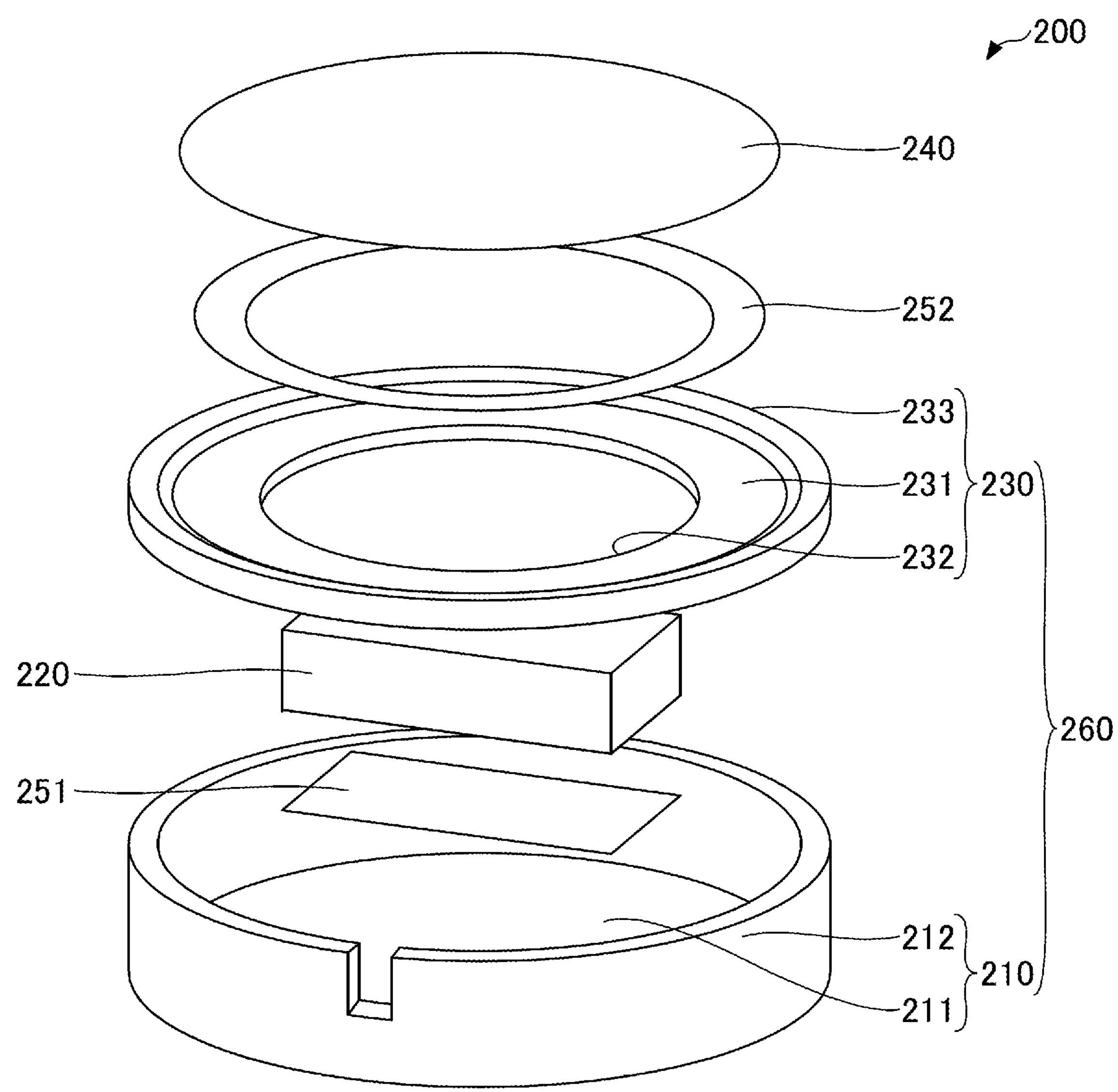
FIG. 3 is a diagram illustrating a configuration of a vibration generation device 200.
Figure 4:
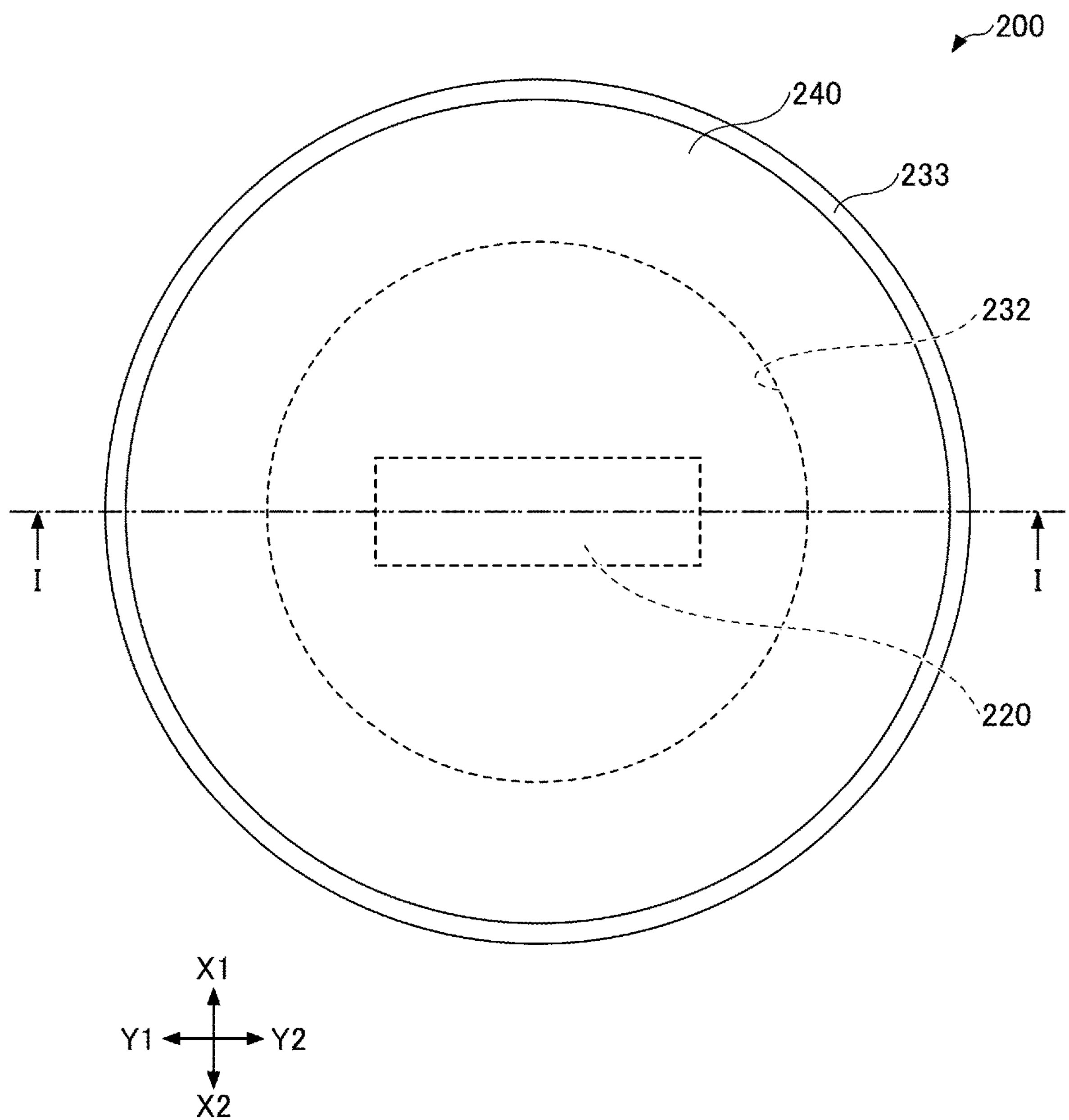
FIG. 4 is a diagram illustrating the configuration of the vibration generation device 200.
Figure 5:
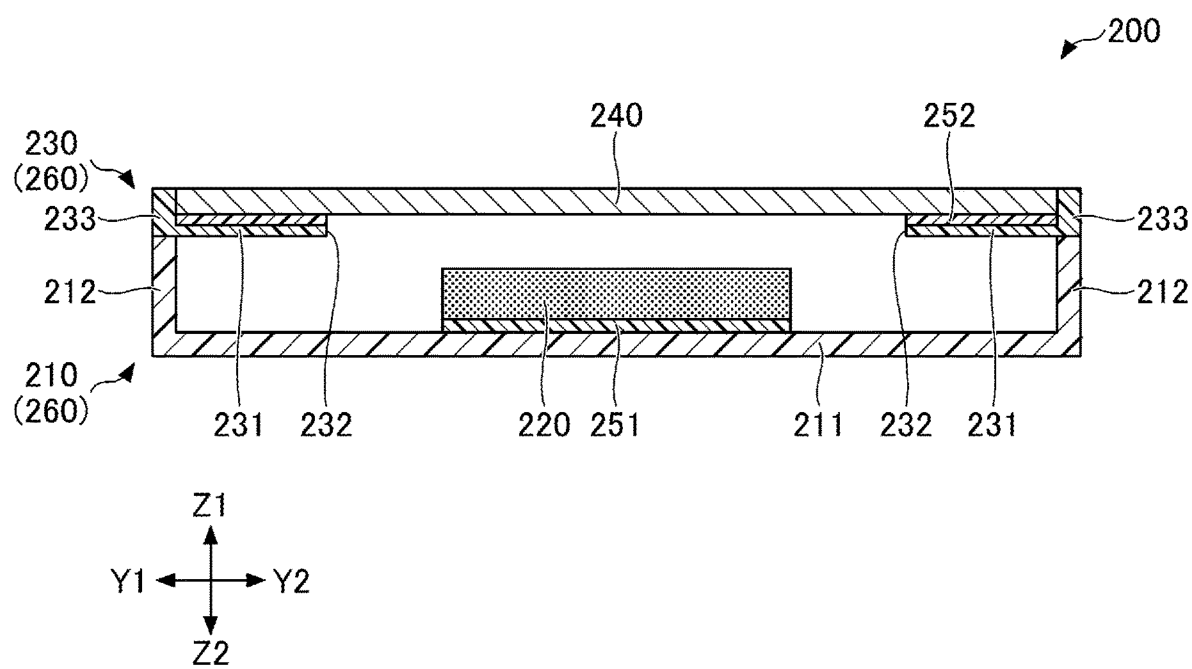
FIG. 5 is a diagram illustrating the configuration of the vibration generation device 200.

Next, the vibration generation device 200 will be described. FIG. 3, FIG. 4, and FIG. 5 are diagrams illustrating the configuration of the vibration generation device 200. FIG. 3 is a disassembled perspective view, FIG. 4 is a plan view, and FIG. 5 is a cross sectional view along a line I-I in FIG. 4, of the vibration generation device 200. Directions in the drawings are defined so that X1 denotes a left direction, X2 denotes a right direction, Y1 denotes a front direction, Y2 denotes a rear direction, Z1 denotes an up direction, and Z2 denotes a down direction.

As illustrated in FIG. 3, FIG. 4, and FIG. 5, the vibration generation device 200 includes a lower case 210, the actuator 220, an upper case 230, and the diaphragm 240. The lower case 210 and the upper case 230 are included in the housing 260. The lower case 210 includes a disk-shaped bottom plate 211, and a cylindrical side plate 212 extending upward from an edge of the bottom plate 211. The actuator 220 is fixed to an upper surface of the bottom plate 211 by a double-tape 251, for example. The upper case 230 includes an annular bottom plate 231 having an opening 232 formed at a center thereof, and a guide portion 233 provided at an edge of the bottom plate 231 to guide the diaphragm 240. The diaphragm 240 has a disk shape, and is fixed to an upper surface of the bottom plate 231 by an annular double-sided tape 252, on an inner side of the guide portion 233, and is held by the upper case 230. For example, the upper case 230 is fixed to the lower case 210, so that the diaphragm 240 is located at a position above the upper case 230. The upper case 230 may be fixed to the lower case 210, so that the diaphragm 240 is located at a position below the upper case 230. The upper case 230 is an example of a holding part.

The diaphragm 240 is supported by the housing 260, and generates the sound by vibrating in a first direction (Z1-Z2 direction). The actuator 220 is attached to the housing 260, and vibrates the housing 260. The actuator 220 vibrates the housing 260 in the first direction at a first frequency f1, and vibrates the housing 260 in a second direction at a second frequency f1 lower than the first frequency f2. For example, the second direction is different from the first direction, and is preferably a direction (Z1-Z2 direction or X1-X2 direction) perpendicular to the first direction (Y1-Y2 direction).

For example, the diaphragm 240 is held by the upper case 230 of the housing 260. The diaphragm 240 is made of a metal, for example, and the housing 260 is made of a synthetic resin, for example.

In the vibration generation device 200, the vibration of the housing 260 in the first direction causes the diaphragm 240 to vibrate in the first direction, and the diaphragm 240 vibrates the surrounding air, thereby generating the sound. The first frequency f1 is not particularly limited, and may be set in a range higher than or equal to 200 Hz and lower than or equal to 6 kHz, for example. The first frequency f1 is more preferably set in a range that is easily detectable by human hearing, that is, in a range higher than or equal to 500 Hz and lower than or equal to 4 kHz, for example. Even when the housing 260 vibrates at the frequency in the range that is easily detectable by the human hearing, it is difficult to detect the vibration by human sense of touch (or tactile sense). For this reason, it is possible to present the sound detectable by the human hearing by the vibration in the first direction at the first frequency f1, substantially without causing the vibration to be detected by the human sense of touch.

In addition, the second frequency f2 is not particularly limited, and may be set in a range lower than or equal to 600 Hz, for example. The second frequency f2 is more preferably set in a range that is easily detectable by human sense of touch, that is, in a range higher than or equal to 50 Hz and lower than or equal to 400 Hz, for example. Even when the first frequency f1 is set in the range higher than or equal to 200 Hz and lower than or equal to 600 Hz, the second frequency f2 may be any frequency lower than the first frequency f1. The human hearing may be able to detect that sound having the frequency that is easily detectable by the human sense of touch, however, in the vibration in the second direction, the diaphragm 240 hardly vibrates in the first direction, and thus, the diaphragm 240 is unlikely to generate a sound. For this reason, the vibration in the second direction at the second frequency f2 can be presented, substantially without causing the vibration to be detected by the human sense of touch.

Figure 6:
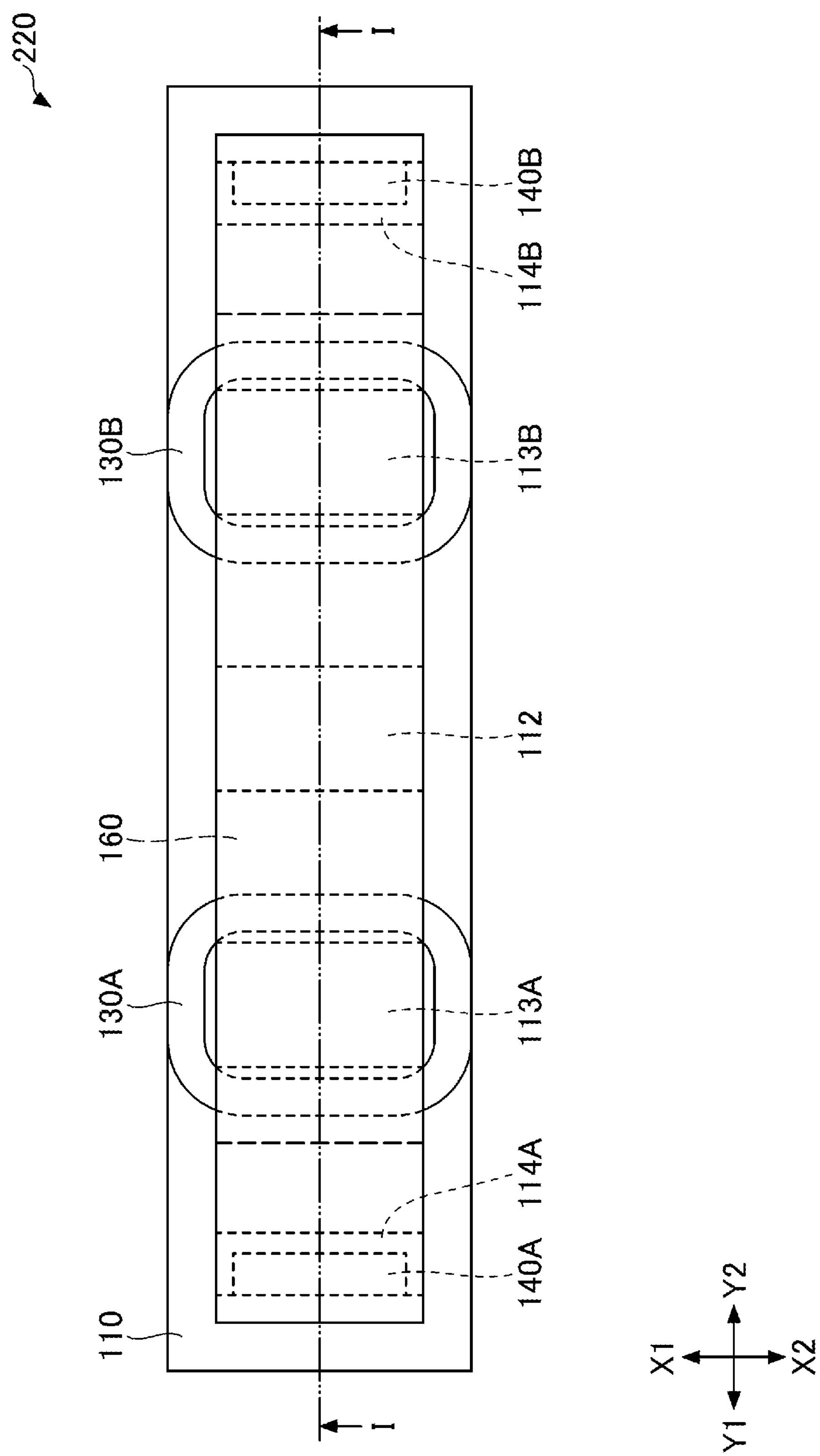
FIG. 6 is a plan view illustrating a configuration of an actuator 220.
Figure 7:
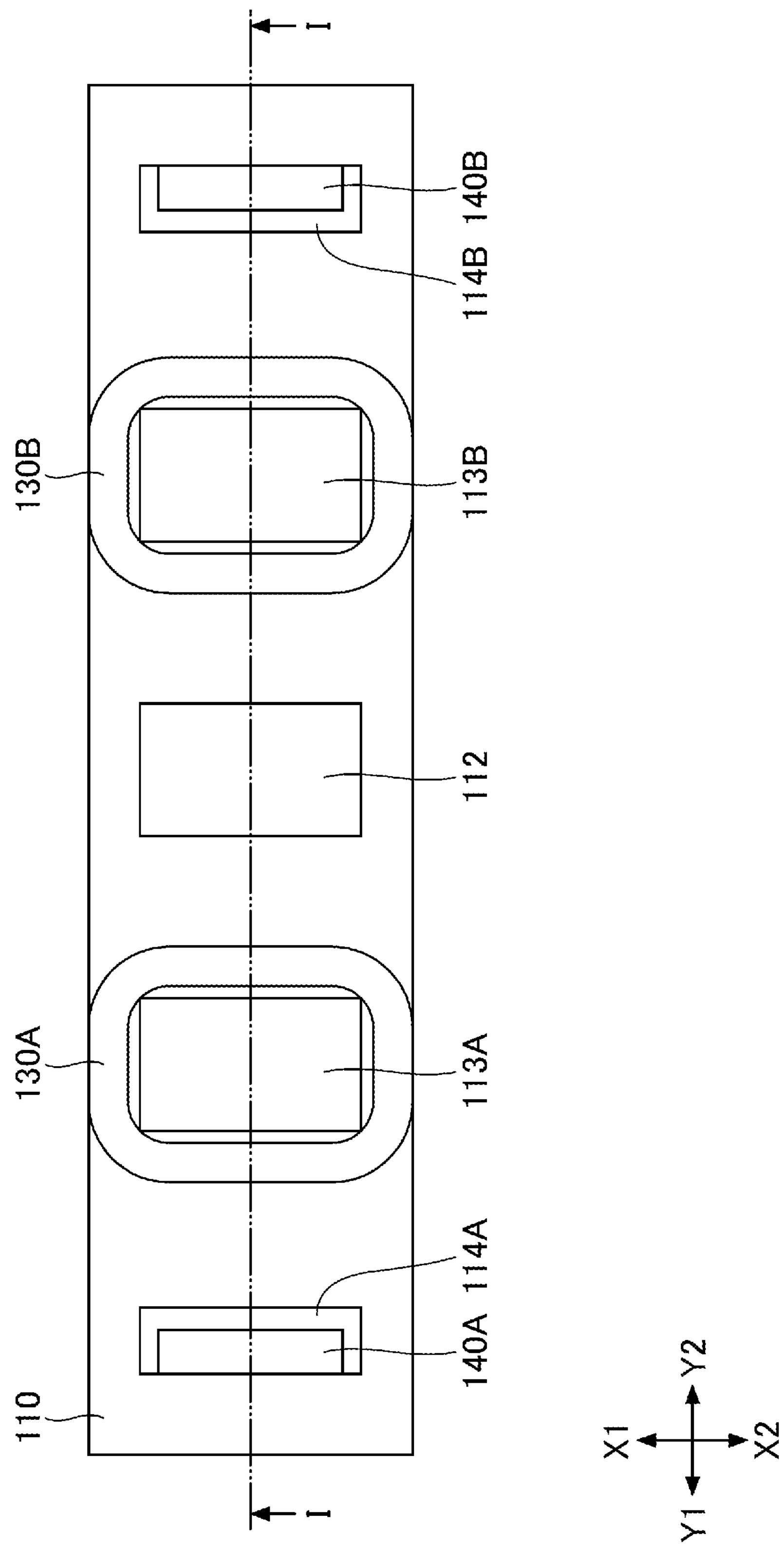
FIG. 7 is a plan view in which a movable yoke and a permanent magnet are removed from FIG. 6.
Figure 8:
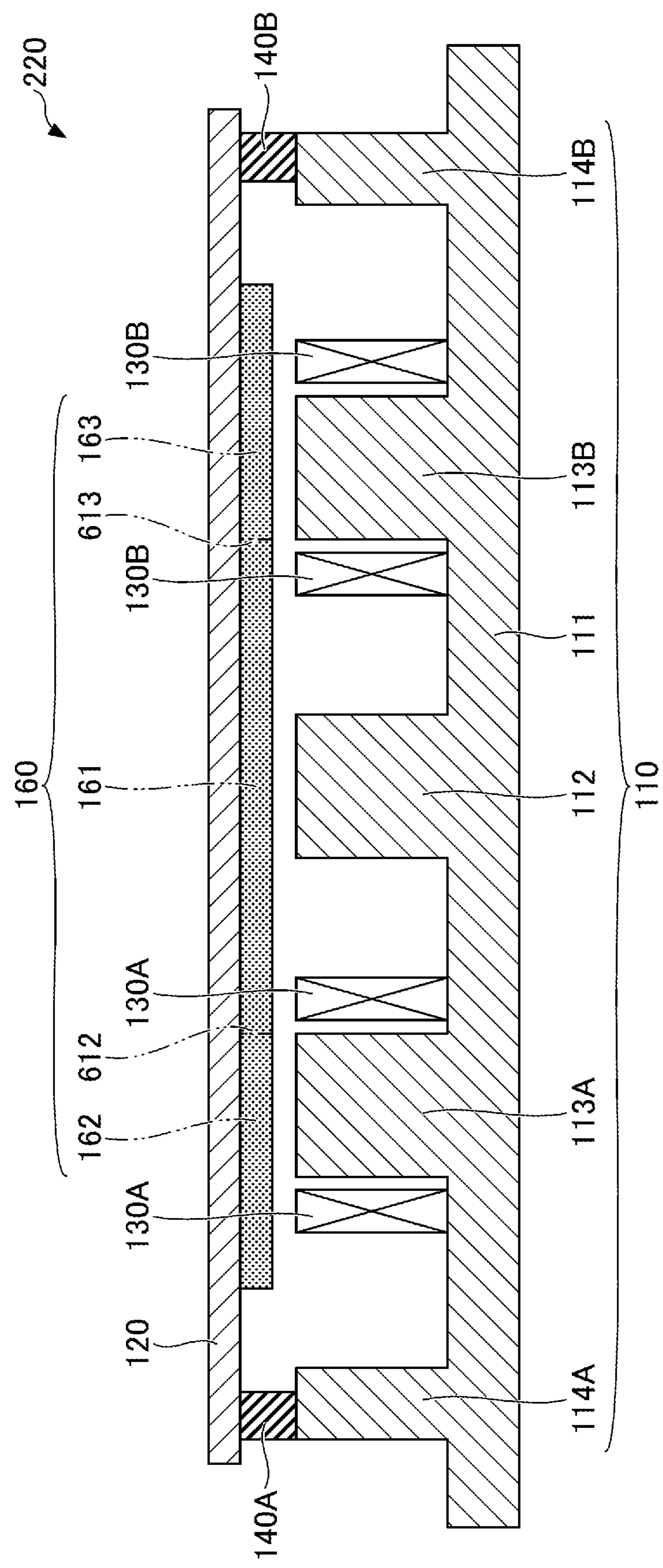
FIG. 8 is a cross sectional view illustrating the configuration of the actuator 220.

Next, an example of the actuator 220 will be described. FIG. 6 is a plan view illustrating a configuration of the actuator 220, FIG. 7 is a plan view in which a movable yoke and a permanent magnet are removed from FIG. 6, and FIG. 8 is a cross sectional view illustrating the configuration of the actuator 220. FIG. 6 corresponds to a cross sectional view taken along the line I-I in FIG. 4 and FIG. 5.

In this example of the actuator 220, the Z1-Z2 direction is an example of the first direction, and the Y1-Y2 direction is an example of the second direction.

As illustrated in FIG. 6 through FIG. 8, the actuator 220 includes a fixed yoke 110, a movable yoke 120, a first excitation coil 130A, a second excitation coil 130B, a first rubber 140A, a second rubber 140B, and a permanent magnet 160. The fixed yoke 110 includes a plate-shaped base 111 having a planar shape that is approximately rectangular. Axial directions of the first excitation coil 130A and the second excitation coil 130B are parallel to the Z1-Z2 direction. The movable yoke 120 is an example of a first yoke, the fixed yoke 110 is an example of a second yoke, and the first rubber 140A and the second rubber 140B are examples of an elastic support part.

The fixed yoke 110 further includes a center projection 112 projecting upward (in the Z1 direction) from a center of the base 111, a first lateral projection 114A projecting upward from an end portion (front end portion) on the Y1 side in a longitudinal direction of the base 111, and a second lateral projection 114B projecting upward from an end portion (rear end portion) on the Y2 side in the longitudinal direction of the base 111. The first lateral projection 114A and the second lateral projection 114B are provided at positions sandwiching the center projection 112 therebetween in the X1-X2 direction. The fixed yoke 110 further includes a first iron core 113A projecting upward from between the center projection 112 and the first lateral projection 114A of the base 111, and a second iron core 113B projecting upward from between the center projection 112 and the second lateral projection 114B of the base 111. The first excitation coil 130A is wound around the first iron core 113A, and the second excitation coil 130B is wound around the second iron core 113B. The first rubber 140A is provided on the first lateral projection 114A, and the second rubber 140B is provided on the second lateral projection 114B. The center projection 112 is an example of a first projection, and the first lateral projection 114A and the second lateral projection 114B are examples of a second projection.

The movable yoke 120 is plate-shaped member having a planar shape that is approximately rectangular. The movable yoke 120 makes contact with the first rubber 140A and the second rubber 140B at the end portions along the longitudinal direction of the movable yoke 120. The permanent magnet 160 is attached to a surface of the movable yoke 120 on the side closer to the fixed yoke 110. The permanent magnet 160 includes a first region 161, a second region 162 located on the Y1 side of the first region 161, and a third region 163 located on the Y2 side of the first region 161. For example, the first region 161 is polarized to become a south pole (or S-pole), and the second region 162 and the third region 163 are polarized to become a north pole (or N-pole). The permanent magnet 160 is attached approximately at a center of movable yoke 120 in the plan view, so that the first region 161 opposes the center projection 112, a boundary 612 between the first region 161 and the second region 162 opposes the first excitation coil 130A, and a boundary 613 between the first region 161 and the third region 163 opposes the second excitation coil 130B. In addition, the boundary 612 is located at a position closer to the Y2 side than to an axial center of the first excitation coil 130A, and the boundary 613 is located at a position closer to the Y1 side than to an axial center of the second excitation coil 130B. That is, the boundary 612 is located at the position closer to the Y2 side than to a center of the first iron core 113A, and the boundary 613 is located at the position closer to the Y1 side than to a center of the second iron core 113B. The permanent magnet 160 polarizes the fixed yoke 110 and the movable yoke 120, and the movable yoke 120 is urged in a direction to approach the fixed yoke 110 in the Z1-Z2 direction by a magnetic attraction force. In addition, due to the magnetic attraction force, both ends of the movable yoke 120 are urged in a direction to approach each of the first lateral projection 114A and the second lateral projection 114B in the Y1-Y2 direction.

When the housing 260 is caused to vibrate, the actuator 220 is driven so that the directions of currents flowing through the first excitation coil 130A and the second excitation coil 130B are alternately reversed. That is, by alternately reversing the direction of the current flowing through each of the first excitation coil 130A and the second excitation coil 130B, a magnetic pole of the surface of the first iron core 113A on the side closer to the movable yoke 120, and a magnetic pole of the surface of the second iron core 113B on the side closer to the movable yoke 120, are alternately reversed independently of each other. As a result, the permanent magnet 160 and the movable yoke 120 undergo a reciprocating motion in the Y1-Y2 direction or the Z1-Z2 direction, according to the direction of the current flowing through the first excitation coil 130A and the direction of the current flowing through the second excitation coil 130B. A relationship between the direction of the current and the direction of the motion will be described later.

For example, the first rubber 140A and the second rubber 140B have a rectangular planar shape whose longitudinal direction is the X1-X2 direction. The first rubber 140A is held between the first lateral projection 114A and the movable yoke 120, and the second rubber 140B is held between the second lateral projection 114B and the movable yoke 120. That is, the first rubber 140A and the second rubber 140B are sandwiched between the fixed yoke 110 and the movable yoke 120. For this reason, unless intentionally disassembled, the first rubber 140A and the second rubber 140B are held between the fixed yoke 110 and the movable yoke 120. The first rubber 140A may be fixed to an upper surface of the first lateral projection 114A, or to a lower surface of the movable yoke 120, or to both the upper surface of the first lateral projection 114A and the lower surface of the movable yoke 120. Similarly, the second rubber 140B may be fixed to an upper surface of the second lateral projection 114B, or to the lower surface of the movable yoke 120, or to both the upper surface of the second lateral projection 114B and the lower surface of the movable yoke 120.

Next, the relationship between the direction of the current and the direction of the motion will be described. In total, there are four kinds of combinations of the direction of the current flowing through the first excitation coil 130A and the direction of the current flowing through the second excitation coil 130B.

Figure 9:
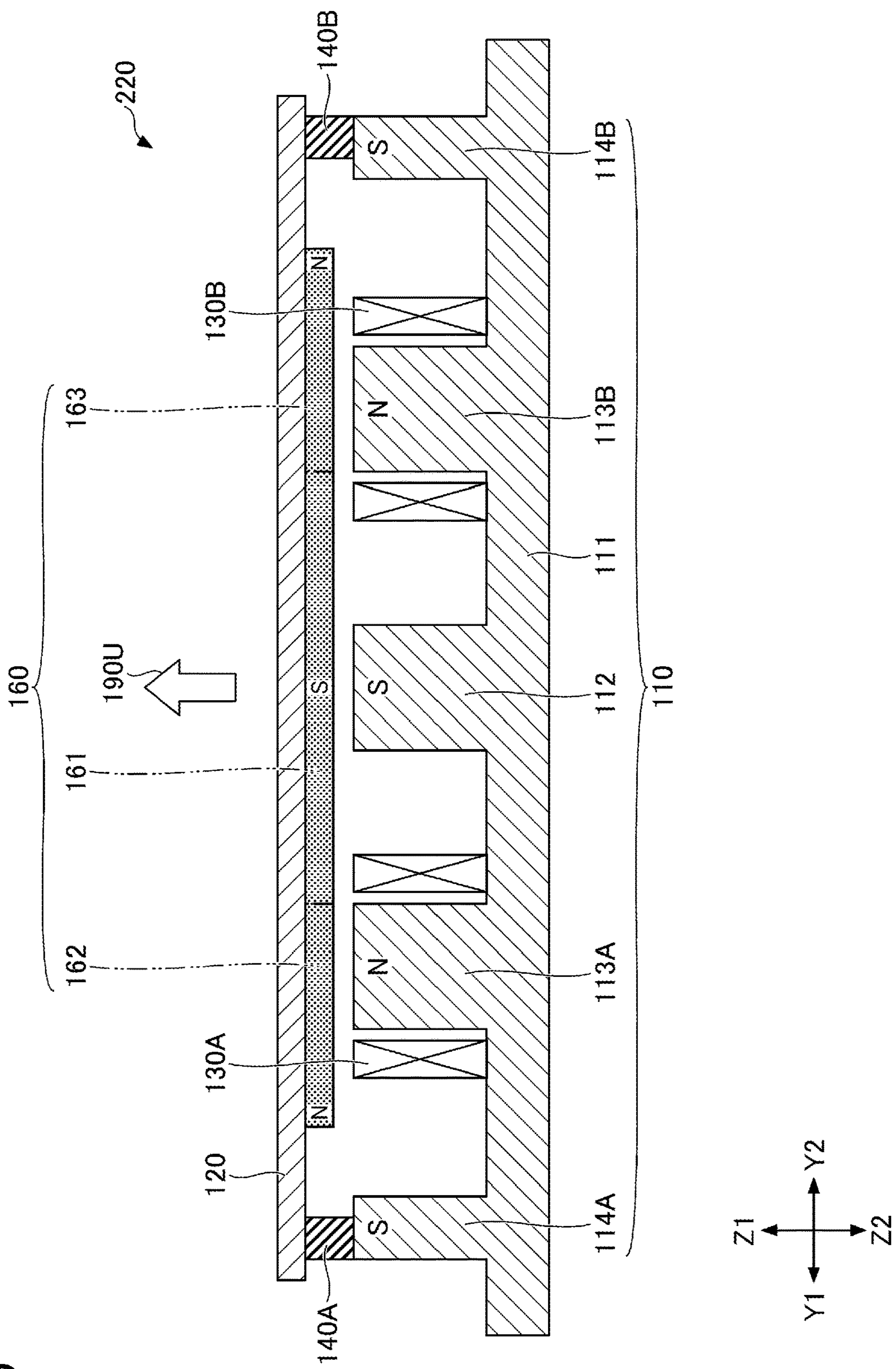
FIG. 9 is a diagram illustrating a relationship between a direction of current and a direction of motion in a first combination.

In a first combination, when viewed from the Z1 side, a current flows counterclockwise (CCW) through the first excitation coil 130A and the second excitation coil 130B. FIG. 9 is a diagram illustrating the relationship between the direction of the current and the direction of the motion for the first combination. In the first combination, as illustrated in FIG. 9, the magnetic pole of the surface of the first iron core 113A on the side closer to the movable yoke 120 is an N-pole, and the magnetic pole of the surface of the second iron core 113B on the side closer to the movable yoke 120 is also an N-pole. On the other hand, the magnetic pole of the surfaces of the center projection 112, the first lateral projection 114A, and the second lateral projection 114B on the side closer to the movable yoke 120 are S-poles. As a result, a magnetic repulsive force acts between the center projection 112 and the first region 161, a magnetic repulsive force acts between the first iron core 113A and the second region 162, and a magnetic repulsive force acts between the second iron core 113B and the third region 163. Accordingly, a force 190U in the direction Z1 acts on the movable yoke 120.

Figure 10:
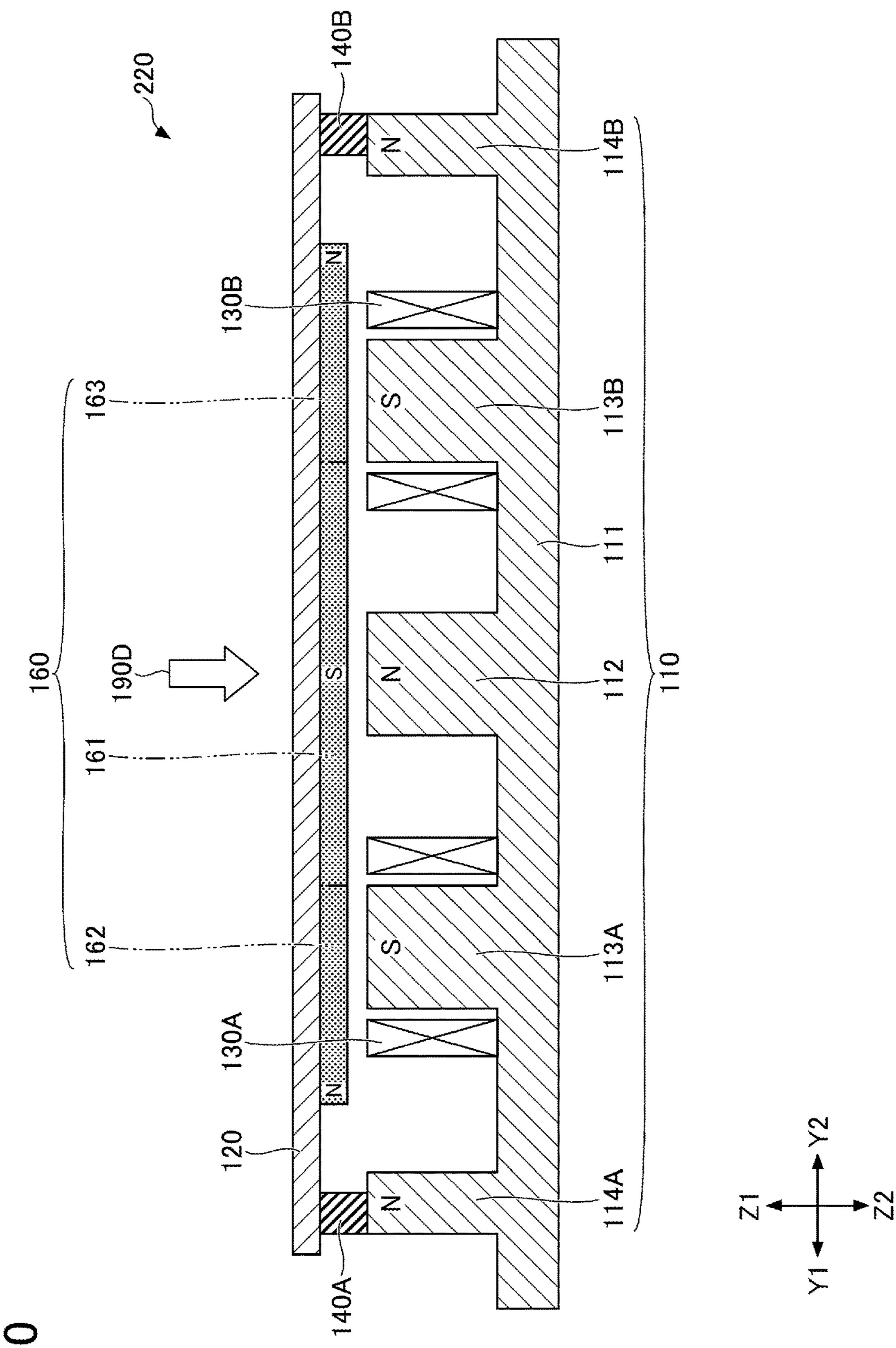
FIG. 10 is a diagram illustrating the relationship between the direction of current and the direction of motion in a second combination.

In a second combination, when viewed from the Z1 side, a current flows clockwise (CW) through the first excitation coil 130A and the second excitation coil 130B. FIG. 10 is a diagram illustrating the relationship between the direction of the current and the direction of the motion for the second combination. In the second combination, as illustrated in FIG. 10, the magnetic pole of the surface of the first iron core 113A on the side closer to the movable yoke 120 is an S-pole, and the magnetic pole of the surface of the second iron core 113B on the side closer to the movable yoke 120 is also an S-pole. On the other hand, the magnetic poles of the surfaces of the center projection 112, the first lateral projection 114A, and the second lateral projection 114B on the side closer to the movable yoke 120 are N-poles. As a result, a magnetic attraction force acts between the center projection 112 and the first region 161, a magnetic attraction force acts between the first iron core 113A and the second region 162, and a magnetic attraction force acts between the second iron core 113B and the third region 163. Accordingly, a force 190D in the direction Z2 acts on the movable yoke 120.

Hence, by repeating the first combination and the second combination so that currents in the same direction flow through the first excitation coil 130A and the second excitation coil 130B, the movable yoke 120 undergoes a reciprocating motion in the Z1-Z2 direction. That is, by supplying the currents to the first excitation coil 130A and the second excitation coil 130B, the movable yoke 120 vibrates in the Z1-Z2 direction from a position in an initial state as a neutral position. As a result, the actuator 220 as a whole vibrates in the Z1-Z2 direction.

Figure 11:
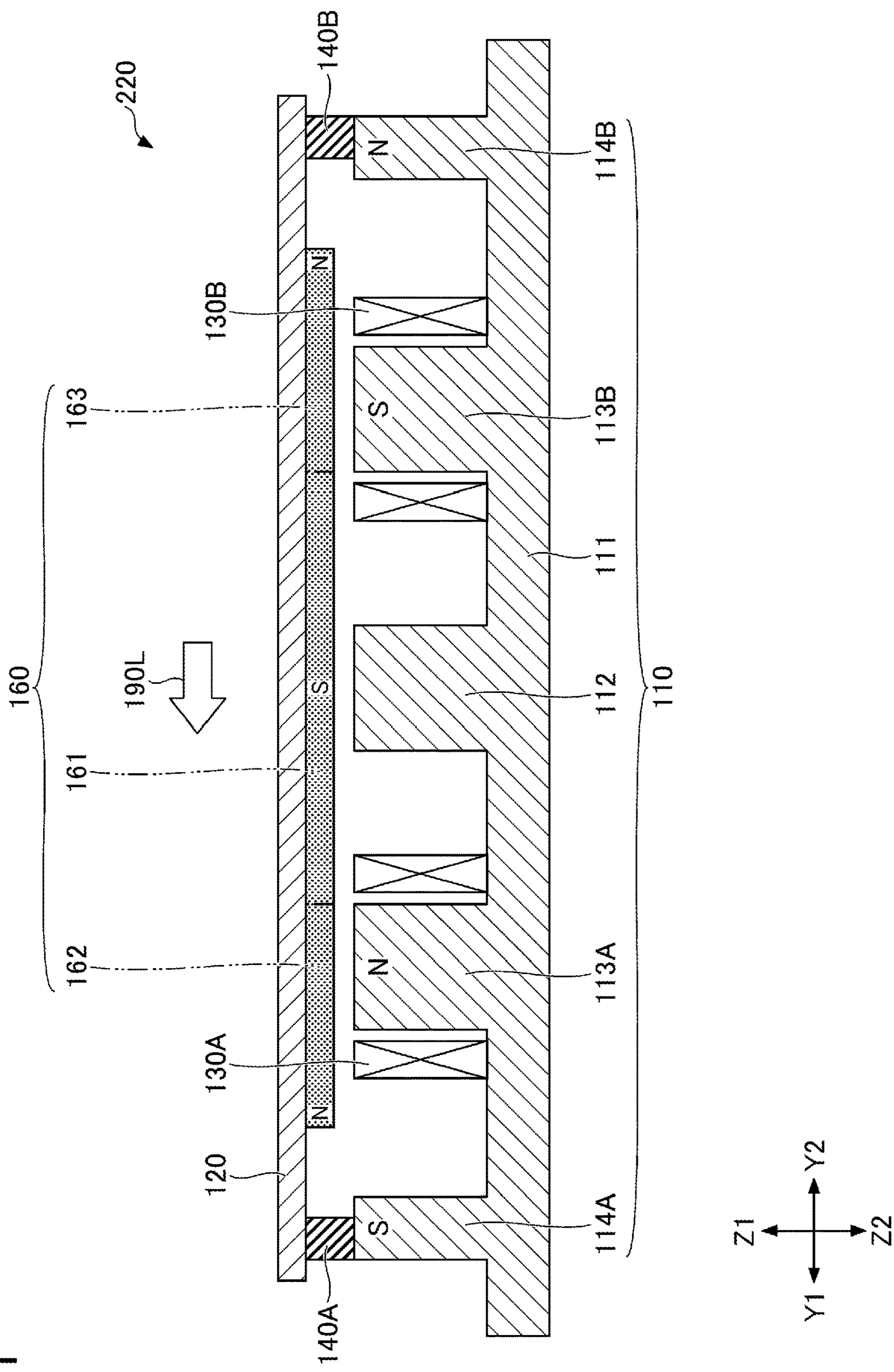
FIG. 11 is a diagram illustrating the relationship between the direction of current and the direction of motion in a third combination.

In a third combination, when viewed from the Z1 side, a current flows counterclockwise (CCW) through the first excitation coil 130A, and a current flows clockwise (CW)

through the second excitation coil 130B. FIG. 11 is a diagram illustrating the relationship between the direction of the current and the direction of the motion for the third combination. In the third combination, as illustrated in FIG. 11, the magnetic pole of the surface of the first iron core 113A on the side closer to the movable yoke 120 is an N-pole, and the magnetic pole of the surface of the second iron core 113B on the side closer to the movable yoke 120 side is an S-pole. Further, the magnetic pole of the surface of the first lateral projection 114A on the side closer to the movable yoke 120 is an S-pole, and the magnetic pole of the surface of the second lateral projection 114B on the side closer to the movable yoke 120 is an N-pole. As a result, a magnetic attraction force acts between the first lateral projection 114A and the second region 162, a magnetic attraction force acts between the first iron core 113A and the first region 161, a magnetic repulsive force acts between the second iron core 113B and the first region 161, and a magnetic repulsive force acts between the second lateral projection 114B and the third region 163. Accordingly, a force 190L in the direction Y1 acts on the movable yoke 120.

Figure 12:
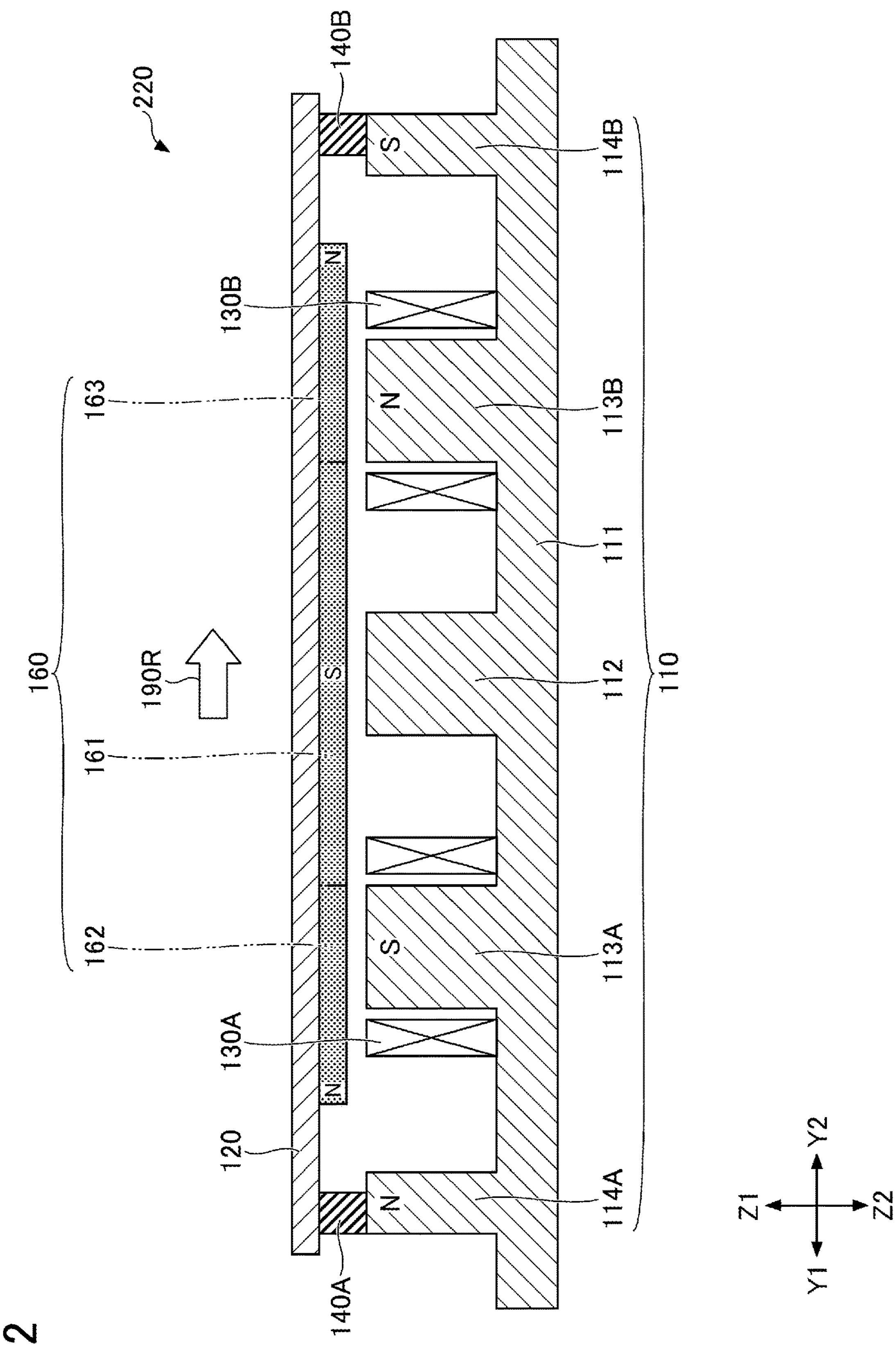
FIG. 12 is a diagram illustrating the relationship between the direction of current and the direction of motion in a fourth combination.

In a fourth combination, when viewed from the Z1 side, a current flows clockwise (CW) through the first excitation coil 130A, and a current flows counterclockwise (CCW) through the second excitation coil 130B. FIG. 12 is a diagram illustrating the relationship between the direction of the current and the direction of the motion for the fourth combination. In the fourth combination, as illustrated in FIG. 12, the magnetic pole of the surface of the first iron core 113A on the side closer to the movable yoke 120 is an S-pole, and the magnetic pole of the surface of the second iron core 113B on the side closer to the movable yoke 120 is an N-pole. Further, the magnetic pole of the surface of the first lateral projection 114A on the side closer to the movable yoke 120 is an N-pole, and the magnetic pole of the surface of the second lateral projection 114B on the side closer to the movable yoke 120 is an S-pole. As a result, a magnetic repulsive force acts between the first lateral projection 114A and the second region 162, a magnetic repulsive force acts between the first iron core 113A and the first region 161, a magnetic attraction force acts between the second iron core 113B and the first region 161, and a magnetic attraction force acts between the second lateral projection 114B and the third region 163. Accordingly, a force 190R in the direction Y2 acts on the movable yoke 120.

Hence, by repeating the third combination and the fourth combination so that currents in opposite directions flow through the first excitation coil 130A and the second excitation coil 130B, the movable yoke 120 undergoes a reciprocating motion in the Y1-Y2 direction. That is, by supplying currents to the first excitation coil 130A and the second excitation coil 130B, the movable yoke 120 vibrates in the Y1-Y2 direction from the position in the initial state as the neutral position. As a result, the actuator 220 as a whole vibrates in the Y1-Y2 direction.

The actuator 220 described above can be used by attaching the surface of the fixed yoke 110 on the Z2 side to the bottom plate 211 of the housing 260, for example. By vibrating the actuator 220 described above in the Z1-Z2 direction, the housing 260 vibrates in the Z1-Z2 direction, thereby causing the diaphragm 240 to vibrate in the Z1-Z2 direction, and generating the sound by the diaphragm 240 vibrating the surrounding air. In addition, by vibrating the actuator 220 in the Y1-Y2 direction, the housing 260 vibrates in the Y1-Y2 direction, thereby presenting the vibration to the user through the seat 11.

Figure 13A:
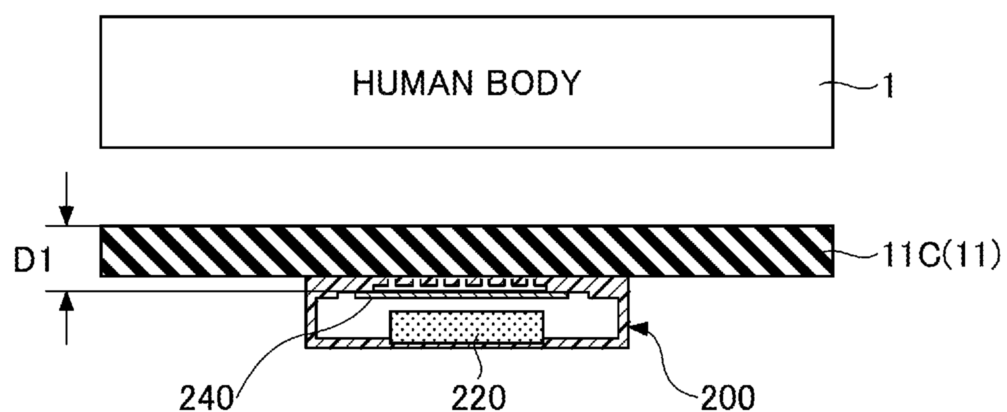
FIG. 13A is a diagram for explaining a non-contact state.
Figure 13B:
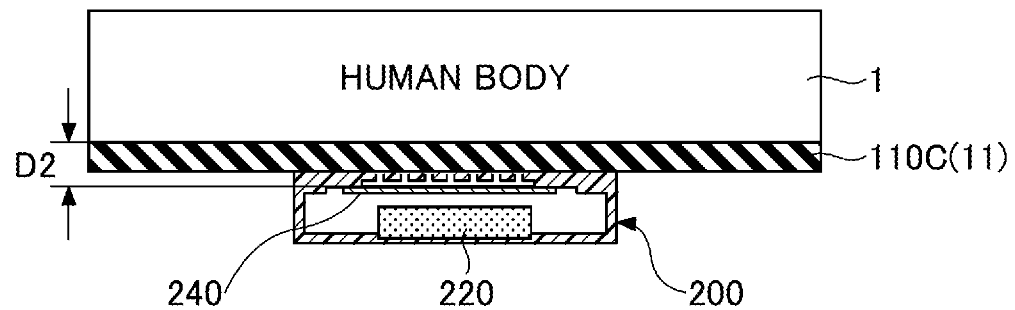
FIG. 13B is a diagram for explaining a close contact state.
Figure 13C:
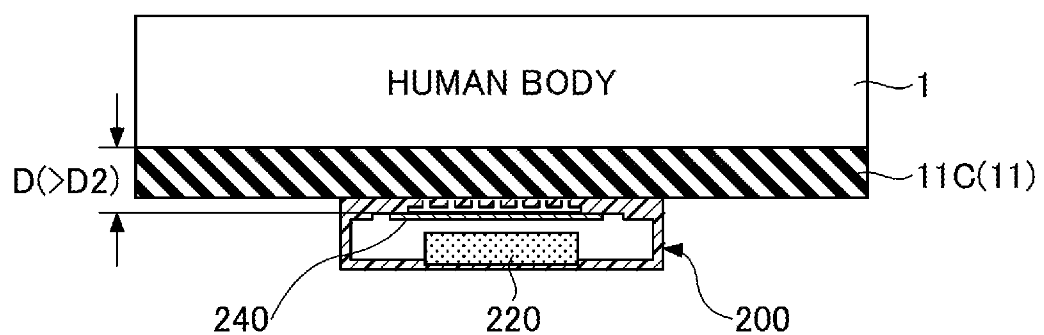
FIG. 13C is a diagram for explaining a contact state.

FIG. 13A, FIG. 13B, and FIG. 13C are diagrams for explaining non-contact state, a close contact state, and a contact state, respectively. FIG. 13A, FIG. 13B, and FIG. 13C illustrate the non-contact state, the close contact state, and the contact state, respectively. As illustrated in FIG. 13A, the non-contact state refers to a state where a user (or human body) 1 is not in contact with the surface (seat covering material 11C) of the seat 11. The electrostatic capacitance value in a state where the user 1 is not seated on nor close to the seat 11 is small compared to the electrostatic capacitance value in a state where the user 1 is close to the seat 11, and the electrostatic capacitance value in a state where the user 1 is seated on the seat 11. For this reason, a threshold value TH1 of the electrostatic capacitance, indicating the state where the user 1 is not seated on nor close to the seat 11, may be stored in the memory 323, and the determination unit 321 may determine the non-contact state when the electrostatic capacitance of the diaphragm 240 is less than or equal to the threshold value TH1, in the case where the predetermined notification condition stands.

Moreover, as illustrated in FIG. 13B, the close contact state refers to a state where the body of the user 1 presses against the seat 11. More particularly, the close contact state refer to the state where the user 1 is in close contact with the seat 11 and the seat 11 is elastically deformed to such an extent that the vibration generated by the vibration generation device 200 can be transmitted to the user 1. When the user 1 sits on the seat 11, it may be regarded that the user 1 is in close contact with the diaphragm 240 of the vibration generation device 200B of the seating part 11B. In addition, in the vibration generation device 200A of the backrest part 11A, the electrostatic capacitance of the diaphragm 240 is different between a state where the user 1 leans against the backrest part 11A and a state where the user 1 does not lean against the backrest part 11A. In the state where the user 1 leans against the backrest part 11A, the back of the user 1 presses against the backrest part 11A. On the other hand, in the state where the user 1 does not lean against the backrest part 11A, the back of the user 1 is separated from the backrest part 11A.

For this reason, when the determination unit 321 determines the close contact state, the following distances D1 and D2 are used. The distance D1 is an example of a first distance, and indicates a distance from the surface of the diaphragm 240 to the surface of the seat 11 in the state where no user 1 is seated on the seat 11, as illustrated in FIG. 13A. The distance D2 is an example of a second distance, and is shorter than the distance D1. The distance D2 indicates a distance from the surface of the diaphragm 240 to the surface of the seat 11 in the state where the user 1 is seated on the seat 11, as illustrated in FIG. 13B. In the close contact state, the distance between the surface of the seat 11 and the surface of the diaphragm 240 is shorter than the corresponding distance in the non-contact state, and is shorter than the corresponding distance in the contact state where the user 1 makes contact with the surface of the seat 11 but is not in close contact with the surface of the seat 11, as illustrated in FIG. 13C. For this reason, the electrostatic capacitance of the diaphragm 240 in the close contact state becomes larger than the electrostatic capacitances in the non-contact state and the contact state. The determination unit 321 may determine the close contact state when the electrostatic capacitance of the diaphragm 240 is greater than or equal to the threshold value TH2 of the electrostatic capacitance, indicating the close contact state, in the case where the predetermined notification condition stands.

The contact state refers to a state where the user 1 makes contact with the surface of the seat 11 but is not in close contact with the seat 11, as illustrated in FIG. 13C. A distance D between the surface of the seat 11 and the surface of the diaphragm 240 in the contact state is greater than the distance D2. For this reason, the determination unit 321 may determine the contact state, when the electrostatic capacitance of the diaphragm 240 is greater than the threshold value TH1 and less than the threshold value TH2, in the case where the predetermined notification condition stands. The close contact state and the contact state may be determined not only on the basis of the electrostatic capacitance of the diaphragm 240, but also on the basis of a value computed from a pressure detected by a pressure sensor and an elastic modulus of the backrest part 11A or the like, or values obtained using other sensors, for example.

Figure 14A:
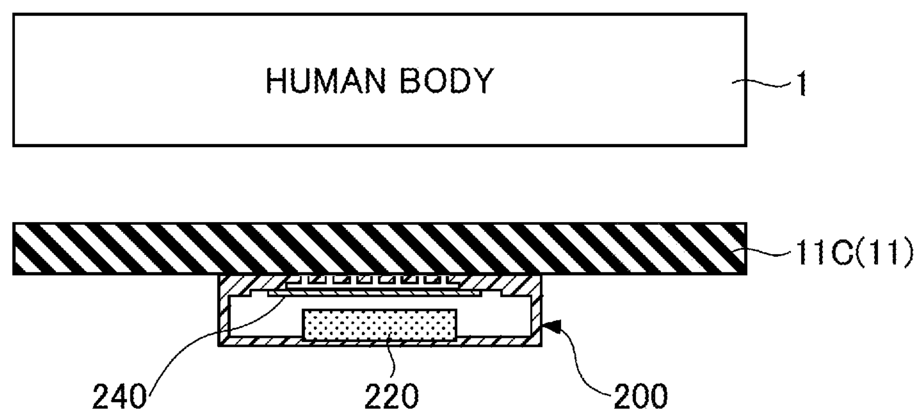
FIG. 14A is a diagram for explaining a generation of vibration or sound by the vibration generation device 200.
Figure 14B:
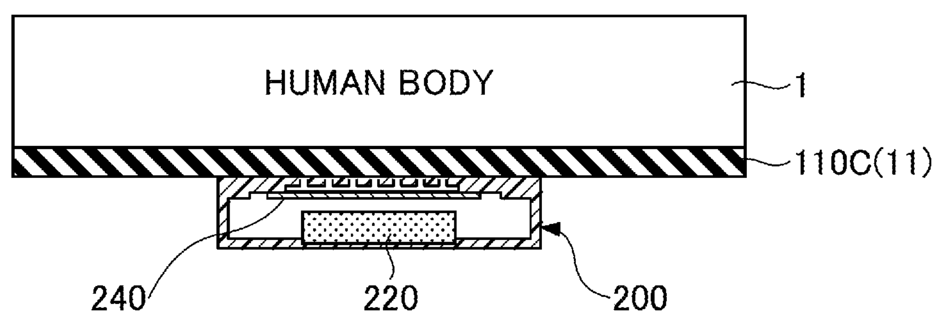
FIG. 14B is a diagram for explaining the generation of vibration or sound by the vibration generation device 200.
Figure 14C:
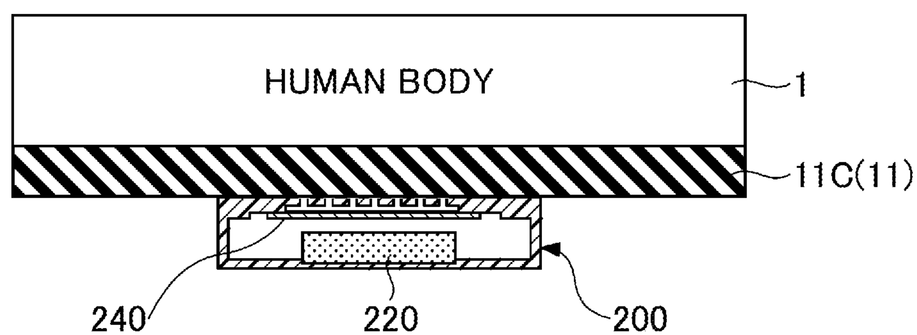
FIG. 14C is a diagram for explaining the generation of vibration or sound by the vibration generation device 200.

FIG. 14A through FIG. 14C are diagrams for explaining the generation of vibration or sound by the vibration generation device 200. FIG. 14A, FIG. 14B, and FIG. 14C illustrate driving states of the vibration generation device 200 in the non-contact state, the close contact state, and the contact state, respectively.

As illustrated in FIG. 14A, in the non-contact state, the control unit 322 causes the vibration generation device 200 to generate a weak sound having a low output level. In the non-contact state, the vibration cannot be transmitted to the user 1, because the user 1 is not in contact with the surface of the seat 11, and the diaphragm 240 is not covered by the user 1. But in the non-contact state, information can be transmitted to the user 1 by the weak sound having the low output level.

As illustrated in FIG. 14B, in the close contact state, the control unit 322 causes the vibration generation device 200 to generate a vibration. In the close contact state, the user 1 is in close contact with the surface of the seat 11, and thus, information can be transmitted to the user 1 by the vibration.

As illustrated in the FIG. 14C, in the contact state, the control unit 322 causes the vibration generation device 200 to generate a strong sound (large sound) having a high output level (large sound). In the contact state, it is difficult to transmit the information to the user 1 by the vibration because the user 1 is not in close contact with the surface of the seat 11, and it is difficult to transmit the information by the weak sound because the user 1 covers the diaphragm 240. For this reason, the output level of the generated sound is made higher than that in the non-contact state, in order to facilitate transmission of the information to the user 1 by the strong sound (large sound).

In the case where the predetermined notification condition stands, the determination unit 321 may determine one of the non-contact state, the close contact state, and the contact state for each of the vibration generation devices 200, separately and independently for each of the vibration generation devices 200. Hence, the control unit 322 may separately and independently cause each of the vibration generation devices 200 to generate one of the weak sound having the low output level, the vibration, and the strong sound having the high output level, according to the determination results of the determination unit 321.

Figure 15:
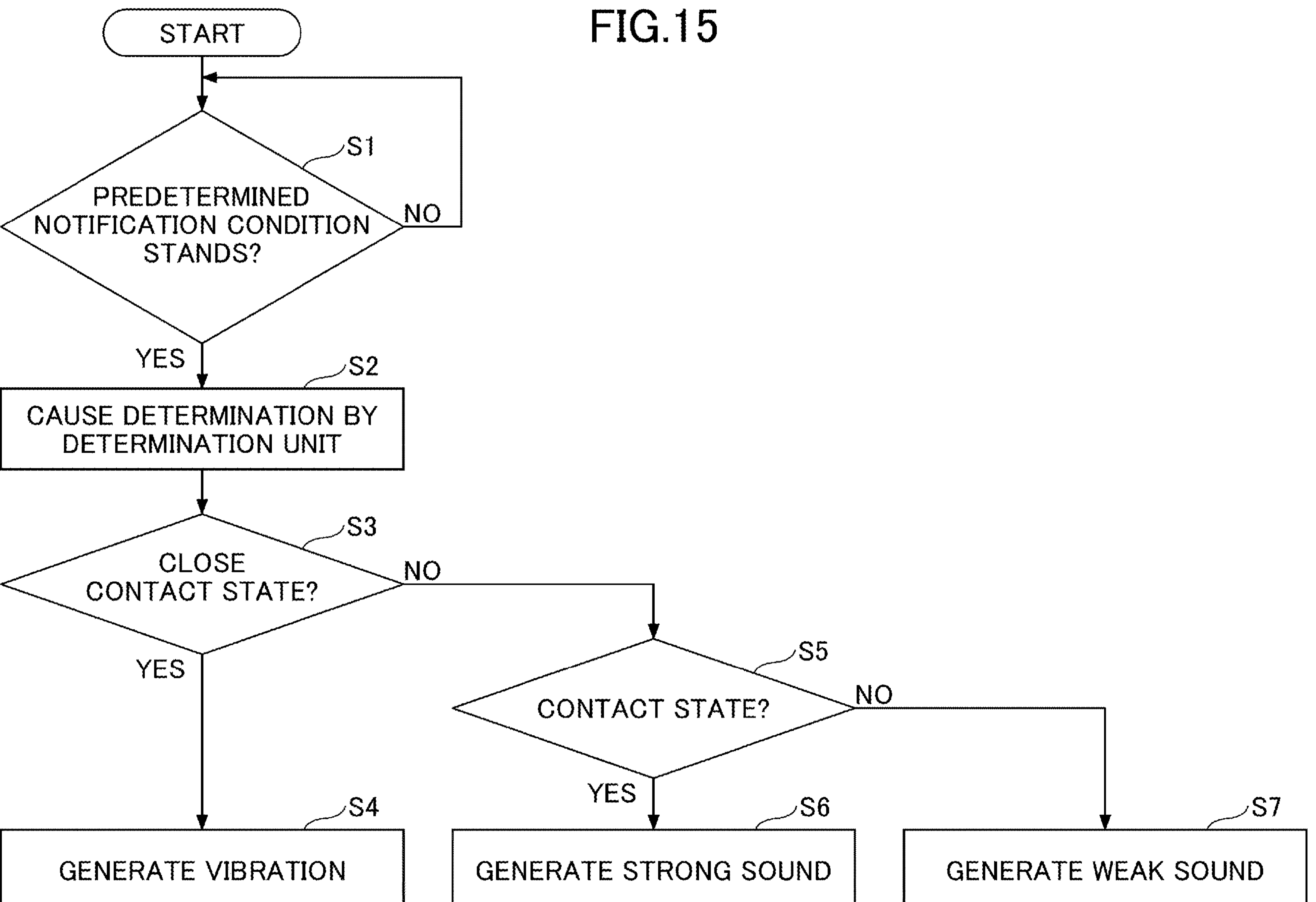
FIG. 15 is a flow chart illustrating examples of processes executed by a control unit 322.

FIG. 15 is a flow chart illustrating examples of processes executed by the control unit 322. When the process starts, the control unit 322 determines whether or not the predetermined notification condition stands (step S1). The predetermined notification condition stands when the control unit 322 receives a notification from the ECU 12 indicating that the predetermined notification condition stands.

The control unit 322 causes the determination unit 321 to determine the state, based on the electrostatic capacitance of the diaphragm 240 (step S2). As a result, the determination unit 321 determines one of the contact state, the close contact state, and the contact state, based on the electrostatic capacitance of the diaphragm 240, and notifies the determination result to the control unit 322.

The control unit 322 determines whether or not the determination result notified from the determination unit 321 indicates the close contact state (step S3). When the control unit 322 determines that the notified determination result indicates the close contact state (YES in step S3), the control unit 322 causes the vibration generation device 200 to generate the vibration (step S4).

On the other hand, when the control unit 322 determines that the notified determination result does not indicate the close contact state (NO in step S3), the control unit 322 determines whether or not the notified determination result indicates the contact state (step S5). When the control unit 322 determines that the notified determination result indicates the contact state (YES in step S5), the control unit 322 causes the vibration generation device 200 to generate the strong sound (step S6).

On the other hand, when the control unit 322 determines that the notified determination result does not indicate the contact state (NO in step S5), the control unit 322 causes the vibration generation device 200 to generate the weak sound (step S7). The series of processes ends after one of steps S4, S6, and S7. The control unit 322 performs the process described above, separately and independently for each of the vibration generation devices 200.

In addition, the control unit 322 may perform the following control. The determination of the three states as described above is effective particularly for the vibration generation devices 200A and 200C arranged in the backrest part 11A. The user 1 may lean strongly against the backrest part 11A, or may lean lightly against the backrest part 11A, or may not lean against the backrest part 11A. The close contact state occurs when the user 1 leans strongly against the backrest part 11A, the contact state occurs when the user 1 leans lightly against the backrest part 11A, and the non-contact state occurs when the user 1 does not lean against the backrest part 11A. As described above, because the three states including the non-contact state, the close contact state, and the contact state are likely to occur at the backrest part 11A, it is effective to distinguish and determine the three states and drive the vibration generation devices 200A and 200C according to the determination results.

Moreover, it is unnecessary to distinguish and determine the three states for the vibration generation devices 200B arranged in the seating part 11B, and a configuration that determines only whether or not the user 1 is in the close contact state may be employed. Because one of the two states including the seated state and the non-seated state is likely to occur with respect to the seating part 11B, the control unit 322 may cause the vibration generation devices 200B to generate the sound when not in the close contact state, and cause the vibration generation devices 200B to generate the vibration when in the close contact state. That is, it is unnecessary to distinguish and determine the contact state and the non-contact state for the vibration generation devices 200B. The determination process of the determination unit 321 can be simplified by employing the configuration that determines only whether or not the close contact state occurs for the vibration generation devices 200B arranged in the seating part 11B. A configuration that determines whether the contact state including the close contact state occurs, or the non-contact state occurs, instead of determining whether or not the close contact state occurs, may be employed for the vibration generation devices 200B.

Further, because the vehicle system 300 includes the plurality of vibration generation devices 200, the following information may be included in the notification received from the ECU 12, to perform a control to notify a direction to the user 1. When the vehicle deviates from the traffic lane and a left side of the vehicle traverses the traffic lane, for example, the vibration generation devices 200A, 200B, and 200C provided on the left side of the seat 11 may be driven to generate vibration or sound, to notify the user 1 that the traffic lane deviation to the left side occurred. In this case, among the vibration generation devices 200A, 200B, and 200C, when the vibration generation devices 200 in the close contact state with the body of the user 1 generate the vibration, and the vibration generation devices 200 in the contact state with the body of the user 1 generate the sound, it is possible to make the notification with directionality regardless of the posture of the user 1.

In addition, six vibration generation devices 200A are arranged in the middle stage and the lower stage (lowermost stage) of the backrest part 11A, and three vibration generation devices 200C are arranged in the upper stage (uppermost stage) of the backrest part 11A. When the back of the user 1 is in close contact with the upper portion of the backrest part 11A, there is a high possibility that the sound generated from the vibration generation devices 200A arranged in the lower portion of the backrest part 11A will be blocked by the back of the user 1 and will not be heard by (that is, reach ears of) the user 1. For this reason, when the determination unit 321 determines the close contact state based on the electrostatic capacitance of the diaphragm 240 of the vibration generation devices 200C, the control unit 322 may not cause the vibration generation devices 200A to generate the sound, regardless of the determination result based on the electrostatic capacitance of the diaphragm 240 of the vibration generation devices 200A. It is possible to save power, by not causing the vibration generation devices 200A to generate the sound.

As described above, the vibration generation device 200 can present the vibration or sound at the position where the approaching user 1 is detected by the diaphragm 240. Hence, it is possible to provide the vehicle seat system 300A, the vehicle system 300, and the vibration generation device 200 capable of presenting the vibration or sound at the position where detection is made. In addition, because the diaphragm 240 that generates the sound is used as the detection electrode of the capacitive sensor, it is possible to save space and reduce the size of the system or device.

In the example described above, the actuator 220 is not attached to the diaphragm 240, and is attached only to the housing 260. However, the actuator 220 may be attached to the diaphragm 240 and the housing 260. In this case, the diaphragm 240 can generate the sound by being directly vibrated by the vibration of the actuator 220. Further, the actuator 220 may be attached only to the diaphragm 240. In this case, the diaphragm 240 and the housing 260 are vibrated by the vibration of the actuator 220, so that the vibration can be presented to the user 1 through the seat 11.

Modifications of First Embodiment

Figure 16A:
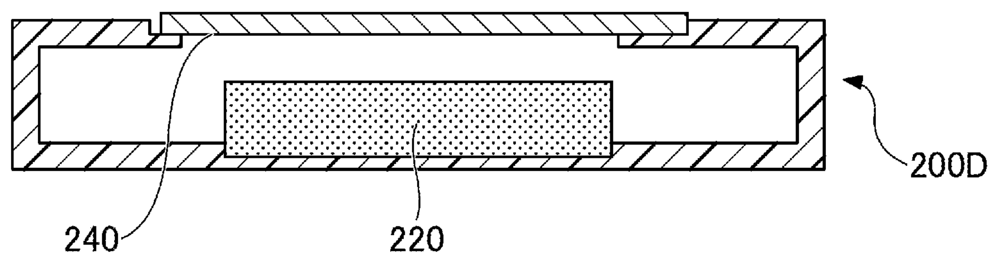
FIG. 16A is a diagram illustrating a vibration generation device 200D according to a first modification of a first embodiment.
Figure 16B:
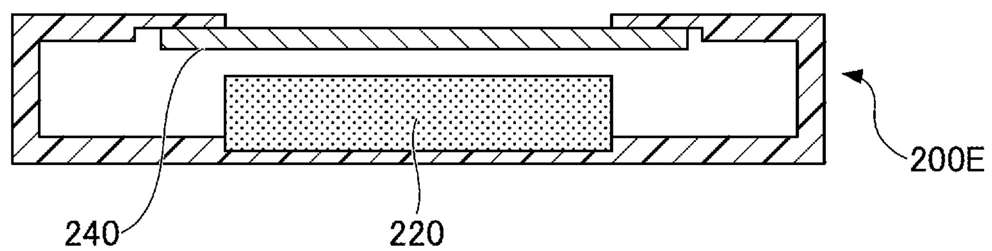
FIG. 16B is a diagram illustrating a vibration generation device 200E according to a second modification of the first embodiment.

Moreover, in the example described above, the cover 310 is attached to the vibration generation device 200, but the cover 310 may be omitted. FIG. 16A is a diagram illustrating a vibration generation device 200D according to a first modification of the first embodiment. FIG. 16B is a diagram illustrating a vibration generation device 200E according to a second modification of the first embodiment. In the vibration generation device 200D illustrated in FIG. 16A, the diaphragm 240 is provided on the outer side of the upper surface of the housing 260. The vibration generation device 200D having such a configuration tolerates the body of the user 1 to make contact with the diaphragm 240 via the seat covering material 11C. Because there is a possibility that a sound quality will change in the state where the body of the user 1 makes contact with the diaphragm 240, the vibration generation device 200D is suited for generating the vibration in the state where the body of the user 1 makes contact with the diaphragm 240.

In the vibration generation device 200E illustrated in FIG. 16B, the diaphragm 240 is provided on the inner side of the upper surface of the housing 260, and the surface of the diaphragm 240 is offset toward the inner side of the housing 260 than the surface of the housing 260. In the vibration generation device 200E having such a configuration, the body of the user 1 is unlikely to make contact with the diaphragm 240 via the seat covering material 11C. Because the diaphragm 240 is offset by an amount corresponding to the thickness of the housing 260, the electrostatic capacitance is detected by a non-contact (or contactless) detection.

Second Through Sixth Embodiments

Figure 17A:
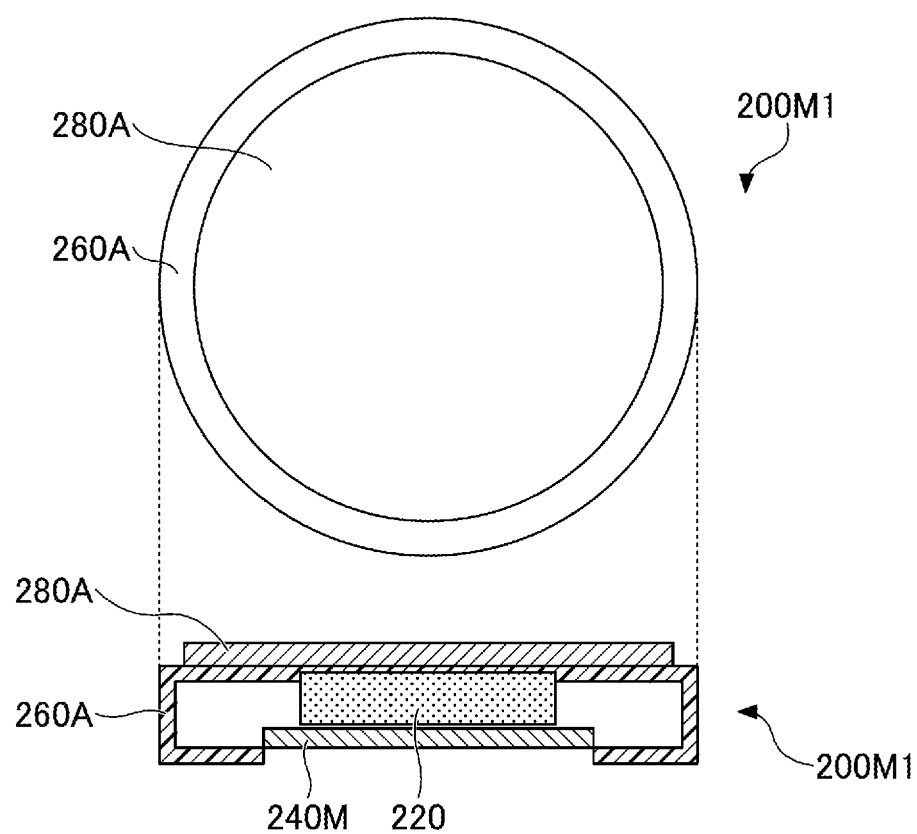
FIG. 17A is a diagram illustrating a vibration generation device 200M1 according to a second embodiment.
Figure 17B:
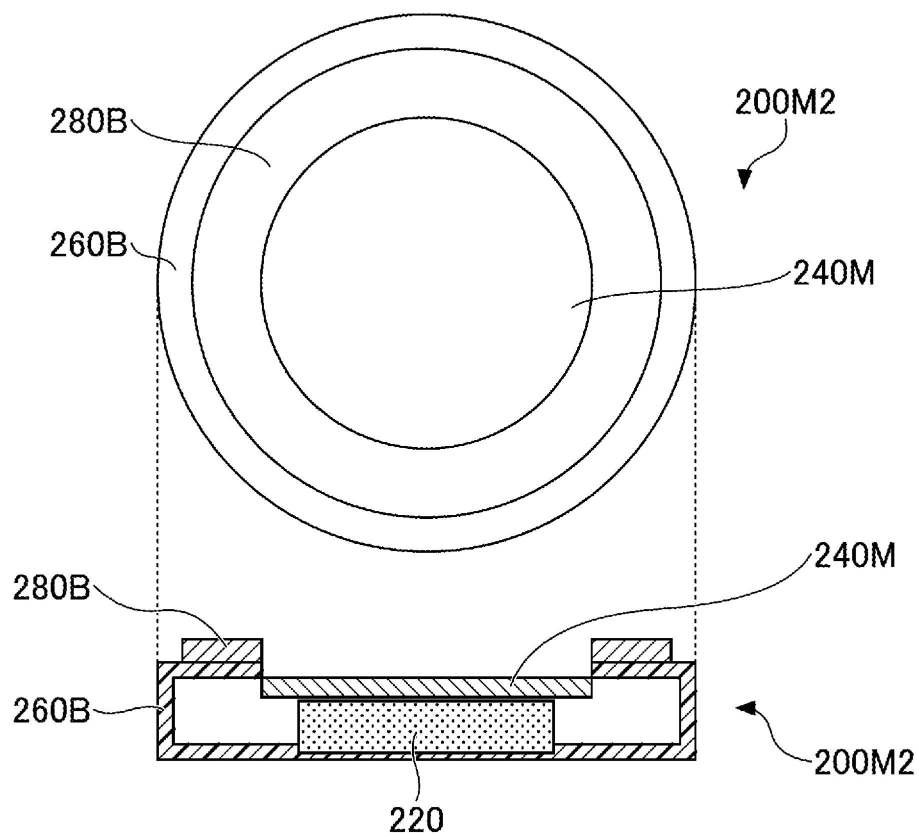
FIG. 17B is a diagram illustrating a vibration generation device 200M2 according to a third embodiment.

Next, further embodiments will be described. FIG. 17A is a diagram illustrating a vibration generation device 200M1 according to a second embodiment. FIG. 17B is a diagram illustrating a vibration generation device 200M2 according to a third embodiment. Similarly to FIG. 2, FIG. 17A and FIG. 17B illustrate both the planar configuration and the cross sectional configuration of the vibration generation devices 200M1 and 200M2, respectively.

The vibration generation device 200M1 illustrated in FIG. 17A includes the actuator 220, a diaphragm 240M, a housing 260A, and a detection electrode 280A. The actuator 220 is similar to the actuator 220 illustrated in FIG. 2, but is attached to a ceiling inside the housing 260. The diaphragm 240M is attached at an opening provided in a lower surface of the housing 260A, and generates a sound. Because the diaphragm 240M does not function as the detection electrode of the capacitive sensor, the diaphragm 240M does not need to include a conductor, and may be made of a resin or the like, for example. The housing 260A differs from the housing 260 illustrated in FIG. 2 in that the housing 260A has the opening in the lower surface where the diaphragm 240M is provided, and does not have an opening in the upper surface, but the configuration of the housing 260A is otherwise similar to that of the housing 260.

The detection electrode 280A is a detection electrode of a sensor, such as a capacitive sensor or the like, for example, and can detect the electrostatic capacitance between the detection electrode 280A and the human body by the self-capacitance type sensing method, for example. The detection electrode 280A has a disk shape, and is provided on an upper surface of the housing 260A. The determination unit 321 of the controller 320 can determine the close contact state, the contact state, and the non-contact state, based on the electrostatic capacitance of the detection electrode 280A. The sensor is not limited to the capacitive sensor, and a resistive pressure sensor or the like, for example, may be used in place of the detection electrode 280A to acquire a physical quantity such as the pressure or the like, in order to detect the approaching user 1. In this case, the determination unit 321 may determine the close contact state, the contact state, and the non-contact state, based on data of the physical quantity output from the sensor.

The vibration generation device 200M2 illustrated in FIG. 17B includes the actuator 220, the diaphragm 240M, the housing 260, and a detection electrode 280B. The actuator 220 is similar to the actuator 220 illustrated in FIG. 2, and is provided at the bottom inside the housing 260. The diaphragm 240M is attached at an opening provided in the upper surface of the housing 260, and generates a sound. Because the diaphragm 240M does not function as the detection electrode of the capacitive sensor, the diaphragm 240M does not need to include a conductor, and may be made of a resin or the like, for example. The housing 260 is similar to the housing 260 illustrated in FIG. 2.

The detection electrode 280B is a detection electrode of a sensor, such as a capacitive sensor or the like, and can detect the electrostatic capacitance between the detection electrode 280B and the human body by the self-capacitance type sensing method, for example. The detection electrode 280B has an annular shape, and is provided on the upper surface of the housing 260. An upper surface of the diaphragm 240M is exposed through an opening at a center of the annular detection electrode 280B. The determination unit 321 of the controller 320 can determine the close contact state, the contact state, and the non-contact state, based on the electrostatic capacitance of the detection electrode 280B. The sensor is not limited to the capacitive sensor, and a resistive pressure sensor or the like, for example, may be used in place of the detection electrode 280B to acquire a physical quantity such as the pressure or the like, in order to detect the approaching user 1. In this case, the determination unit 321 may determine the close contact state, the contact state, and the non-contact state, based on data of the physical quantity output from the sensor.

Figure 18A:
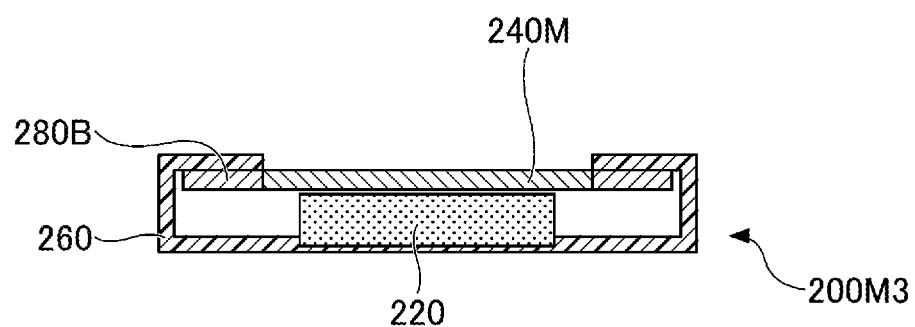
FIG. 18A is a diagram illustrating a vibration generation device 200M3 according to a fourth embodiment.
Figure 18B:
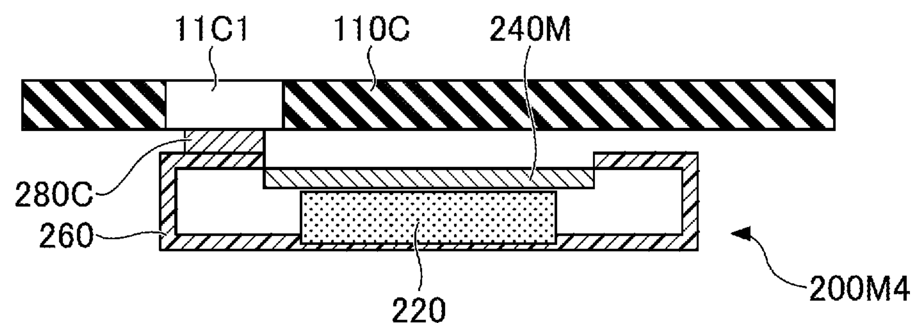
FIG. 18B is a diagram illustrating a vibration generation device 200M4 according to a fifth embodiment.
Figure 18C:
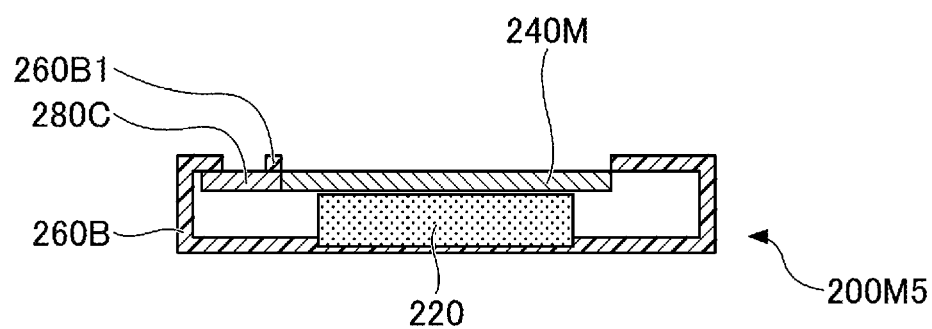
FIG. 18C is a diagram illustrating the vibration generation device 200M4 according to a sixth embodiment.

FIG. 18A is a diagram illustrating a vibration generation device 200M3 according to a fourth embodiment. FIG. 18B is a diagram illustrating a vibration generation device 200M4 according to a fifth embodiment. FIG. 18C is a diagram illustrating a vibration generation device 200M5 according to a sixth embodiment. The vibration generation device 200M3 illustrated in FIG. 18A has a configuration including the detection electrode 280B of the vibration generation device 200M2 illustrated in FIG. 17B, but the position of the detection electrode 280B is moved from the upper surface of the housing 260 to the ceiling inside the housing 260. In the vibration generation device 200M3 having such a configuration, the detection electrode 280B uneasily makes direct contact with the seat covering material 11C or the human body.

The vibration generation device 200M4 illustrated in FIG. 18B includes an optical sensor 280C in place of the detection electrode 280B of the vibration generation device 200M2 illustrated in FIG. 17B. The optical sensor 280C is an infrared (IR) sensor, for example, and includes a light emitting element and a light receiving element. The optical sensor 280C is provided on the upper surface of the housing 260, and an opening 11C1 is provided in the seat covering material 11C in alignment with the position of the optical sensor 280C. The optical sensor 280C emits infrared light from the light emitting element through the opening 11C1, receives reflected light by the light receiving element through the opening 11C1, and outputs a signal according to an amount of received light to the determination unit 321.

The determination unit 321 determines the non-contact state when the amount of received light indicated by the signal input from the optical sensor 280C corresponds to the amount of received light reflected from a position farther away from the optical sensor 280C than the upper surface of the seat covering material 11C in the non-seated state. The determination unit 321 determines the contact state when the amount of received light indicated by the signal input from the optical sensor 280C corresponds to the amount of received light reflected from a position at the surface of the seat covering material 11C in the non-seated state. The determination unit 321 determines the close contact state when the amount of received light indicated by the signal input from the optical sensor 280C corresponds to the amount of received light reflected from a position closer to the optical sensor 280C than the surface of the seat covering material 11C in the non-seated state. The light emitting element and the light receiving element may be integrated into a single integral unit, or may be provided as separate units, in the optical sensor 280C.

The vibration generation device 200M5 illustrated in FIG. 18C has a configuration including the optical sensor 280C of the vibration generation device 200M4 illustrated in FIG. 18B, but optical sensor 280C is provided on an inner side of a housing 260B. The housing 260B of the vibration generation device 200M5 has an opening 260B1 beside the opening for the diaphragm 240 on the upper surface of the housing 260B. The opening 260B1 is provided to allow the IR light of the optical sensor 280C to pass through the housing 260B. The vibration generation device 200M5 having such a configuration may be used in place of the vibration generation device 200M4.

The vibration generation devices 200M1 through 200M5 illustrated in FIG. 17A through FIG. 18C may not include the diaphragm 240. A sound, such as a notification sound or the like, may be generated from a speaker (sound generation unit) inside the cabin of the vehicle 10. Further, the vibration generation devices 200M1 through 200M3 may not include the detection electrodes 280A and 280B, and may include instead a detection electrode of a sensor, such as a capacitive sensor or the like, provided in the vehicle 10, separately from the vibration generation devices 200M1 to 200M3. Similarly, the vibration generation devices 200M4 and 200M5 may not include the optical sensor 280C, and may include instead an electrode of a capacitive sensor provided in the vehicle 10, separately from the vibration generation devices 200M4 and 200M5. In these cases, the state of the user 1 can be determined regardless of the posture of the user 1 or the positional relationship between the user 1 and the vibration generation devices 200M1 through 200M5.

Although the vehicle system and the vibration generation device according to the embodiments and modifications of the present invention are described above, the present invention is not limited to the specifically disclosed embodiments and modifications, and various variations, modifications, and substitutions may be made without departing from the scope of the present invention.

For example, although the controller 320 is arranged on the back of the dashboard in the described embodiments, the position of the controller 320 is not particularly limited, and the controller 320 may be provided inside (that is, built into) the seat 11, for example. In addition, the controller 320 is not limited to being externally connected to the vibration generation device 200, and a part or all of the controller 320 may be arranged inside the vibration generation device 200.

In the described embodiments, the actuator 220 vibrates in the first direction to generate the sound from the diaphragm 240, and the actuator 220 vibrates in the second direction to present vibration to the user 1 through the housing 260 and the seat 11. However, the actuator 220 may vibrate in only one direction, and the generation of sound and the presentation of vibration may be switched by switching the vibration frequency. In this case, an actuator that can vibrate only in one direction may be used in place of the actuator 220.

According to the present disclosure, it is possible to provide a vehicle system and a vibration generation device capable of presenting vibration or sound at a position where a detection is made.

Although the embodiments and the modifications are numbered with, for example, "first," "second," or the like, the ordinal numbers do not imply priorities of the embodiments and the modifications. Many other variations and modifications will be apparent to those skilled in the art.

What is claimed is:

1. A vehicle system comprising:

a seat of a vehicle; and a first vibration generation device provided in the seat, wherein the first vibration generation device includes a first housing, a first diaphragm supported on the first housing, a first actuator attached to at least one of the first housing and the first diaphragm, and a first sensor, including a first detection electrode, and configured to detect a user approaching the first detection electrode, and wherein the first diaphragm and the first detection electrode are formed by a common member.

2. The vehicle system as claimed in claim 1, further comprising:

a controller configured to determine a first state when a capacitance of the first sensor is greater than or equal to a first threshold value.

3. The vehicle system as claimed in claim 2, wherein, in the first state, the controller determines that the user is at a position that is less than or equal to a first distance from the first sensor.

4. The vehicle system as claimed in claim 2, wherein the controller controls the first vibration generation device to vibrate the seat by vibration of the first vibration generation device in the first state, and controls the first vibration generation device to generate a sound when the controller determines that the capacitance of the first sensor is less than the first threshold value.

5. The vehicle system as claimed in claim 4, wherein the first housing vibrates to vibrate the seat according to the vibration of the first actuator to vibrate the seat, and the first diaphragm generates the sound by vibrating according to the vibration of the first actuator.

6. The vehicle system as claimed in claim 4, wherein:

the controller is configured to further determine a second state when the capacitance of the first sensor is less than or equal to a second threshold value smaller than the first threshold value, and a third state when the capacitance of the first sensor is greater than the second threshold value and less than the first threshold value, and the controller in the third state controls the first vibration generation device to generate a sound that is larger than the sound generated by the first vibration generation device in the second state.

7. The vehicle system as claimed in claim 6, further comprising:

a second vibration generation device provided in a seating part of the seat, wherein:

the first vibration generation device is provided in a backrest part of the seat, and the second vibration generation device includes a second housing, a second diaphragm supported on the second housing, a second actuator attached to at least one of the second housing and the second diaphragm, and a second sensor, including a second detection electrode, and configured to detect the user approaching the second detection electrode, the controller is configured to determine the first state when a capacitance of the second sensor is greater than or equal to a third threshold value, control the second vibration generation device to vibrate the seat by vibration of the second vibration generation device in the first state, and control the second vibration generation device to generate a sound when the controller determines that the capacitance of the second sensor is less than the third threshold value.

8. The vehicle system as claimed in claim 7, wherein the controller only determines the first state with respect to the seating part.

9. The vehicle system as claimed in claim 6, wherein:

in the first state, the user is at a position that is less than or equal to a first distance from the first sensor, and in the third state, a body of the user makes contact with a surface of the seat but the user is at a position that is a second distance greater than the first distance from the first sensor.

10. The vehicle system as claimed in claim 6, wherein, in the second state, a body of the user makes no contact with a surface of the seat.

11. The vehicle system as claimed in claim 4, wherein the first vibration generation device is provided in a first region of a backrest part of the seat, the vehicle system further comprising:

a third vibration generation device provided in a second region of the backrest part above the first region, the third vibration generation device including a third housing, a third diaphragm supported on the third housing, a third actuator attached to at least one of the third housing and the third diaphragm, and a third sensor, including a third detection electrode, and configured to detect the user approaching the third detection electrode, the controller is configured to determine the first state with respect to the second region of the backrest part when a capacitance of the third sensor is greater than or equal to a fourth threshold value, and control the third vibration generation device to vibrate the seat by vibration of the third vibration generation device while controlling the first vibration generation device to not generate sound, when the controller determines the first state with respect to the second region of the backrest part, regardless of a determination result of the controller with respect to the capacitance of the first sensor.

12. The vehicle system as claimed in claim 4, wherein the controller controls the first vibration generation device to vibrate or generate the sound in response to a notification indicating that a condition necessary for issuing an alert to the user is satisfied.

13. The vehicle system as claimed in claim 2, comprising:

a plurality of the first vibration generation devices, wherein the controller determines the first state at positions of the seat where the plurality of first vibration generation devices are provided.

14. The vehicle system as claimed in claim 2, wherein, in the first state, a body of the user presses against the seat and the seat is elastically deformed to such an extent that vibration generated by the first vibration generation device is transmittable to the user.

15. The vehicle system as claimed in claim 1, wherein the controller is configured to determine a first state when a physical quantity of an output of the first sensor is greater than or equal to a first threshold value, determine a second state when the physical quantity of the output of the first sensor is less than or equal to a second threshold value smaller than the first threshold value, and determine a third state when the physical quantity of the output of the first sensor is greater than the second threshold value and less than the first threshold value.

16. The vehicle system as claimed in claim 15, wherein:

in the first state, a body of the user presses against the seat and the seat is elastically deformed to such an extent that vibration generated by the first vibration generation device is transmittable to the user, and the user is at a position that is less than or equal to a first distance from the first sensor, in the second state, the body of the user makes no contact with a surface of the seat, and in the third state, the body of the user makes contact with the surface of the seat but the user is at a position that is a second distance greater than the first distance from the first sensor.

17. A vibration generation device adaptable to a seat of a vehicle, comprising:

a housing;

a diaphragm supported on the housing;

an actuator attached to at least one of the housing and the diaphragm; and a sensor, including a detection electrode, and configured to detect a target approaching the detection electrode, wherein the diaphragm and the detection electrode are formed by a common member.

* * * * *